US012243491B2

(12) United States Patent
Kim et al.

(10) Patent No.: US 12,243,491 B2
(45) Date of Patent: Mar. 4, 2025

(54) DISPLAY PANEL

(71) Applicant: Samsung Display Co., Ltd., Yongin-si (KR)

(72) Inventors: Haemin Kim, Yongin-si (KR); Youngwan Seo, Yongin-si (KR); Byungchang Yu, Yongin-si (KR); Geunho Lee, Yongin-si (KR); Kyunghoon Chung, Yongin-si (KR)

(73) Assignee: SAMSUNG DISPLAY CO., LTD, Yongin-si (KR)

( * ) Notice: Subject to any disclaimer, the term of this patent is extended or adjusted under 35 U.S.C. 154(b) by 0 days.

(21) Appl. No.: 18/339,558

(22) Filed: Jun. 22, 2023

(65) Prior Publication Data
US 2024/0054960 A1 Feb. 15, 2024

(30) Foreign Application Priority Data
Aug. 10, 2022 (KR) .................. 10-2022-0099729

(51) Int. Cl.
*G09G 3/3266* (2016.01)
(52) U.S. Cl.
CPC .................. *G09G 3/3266* (2013.01)
(58) Field of Classification Search
CPC ............ G09G 3/3266; G09G 3/3674; G09G 3/3677; G09G 2310/0286; H01L 29/78696; H01L 29/78648
See application file for complete search history.

(56) References Cited

U.S. PATENT DOCUMENTS

| | | | |
|---|---|---|---|
| 8,766,265 B2 | 7/2014 | Lee et al. | |
| 11,515,425 B2 | 11/2022 | Ko | |
| 11,764,232 B2 | 9/2023 | Liu et al. | |
| 2005/0101066 A1 | 5/2005 | Arao et al. | |
| 2018/0047764 A1* | 2/2018 | Deng | H01L 27/124 |
| 2018/0076102 A1 | 3/2018 | Ka et al. | |
| 2018/0144685 A1 | 5/2018 | Gong et al. | |

(Continued)

FOREIGN PATENT DOCUMENTS

| | | |
|---|---|---|
| CN | 113013179 | 6/2021 |
| JP | H11-95256 | 4/1999 |

(Continued)

OTHER PUBLICATIONS

Extended European Search Report for European Patent Application or Patent No. 23188388.5 dated Dec. 20, 2023.

*Primary Examiner* — Yuzhen Shen
(74) *Attorney, Agent, or Firm* — KILE PARK REED & HOUTTEMAN PLLC

(57) ABSTRACT

A display panel includes a scan driving circuit. The scan driving circuit includes a first transistor that outputs a high-voltage of a scan signal during a turn-on period. The first transistor includes a first semiconductor pattern layer including a first input region, a first output region, and a first channel region, a first gate electrode overlapping the first channel region, a second semiconductor pattern layer including a second input region electrically connected to the first input region, a second output region electrically connected to the first output region, and a second channel region overlapping the first channel region, and a second gate electrode overlapping the second channel region, and electrically connected to the first gate electrode.

25 Claims, 25 Drawing Sheets

(56) References Cited

U.S. PATENT DOCUMENTS

| | | | |
|---|---|---|---|
| 2019/0273168 A1* | 9/2019 | Matsukizono | H01L 27/1251 |
| 2021/0057458 A1* | 2/2021 | Kim | H01L 27/1285 |
| 2022/0123120 A1 | 4/2022 | Lee et al. | |
| 2022/0406946 A1 | 12/2022 | Seong et al. | |
| 2022/0415933 A1* | 12/2022 | Liu | G02F 1/1368 |
| 2023/0061581 A1* | 3/2023 | Ko | H01L 29/78603 |
| 2023/0361189 A1* | 11/2023 | Lee | H01L 29/42384 |

FOREIGN PATENT DOCUMENTS

| | | |
|---|---|---|
| KR | 10-1837625 | 3/2018 |
| KR | 10-2021-0022808 | 3/2021 |
| WO | 2021/101242 | 5/2021 |
| WO | 2021/254053 | 12/2021 |

\* cited by examiner

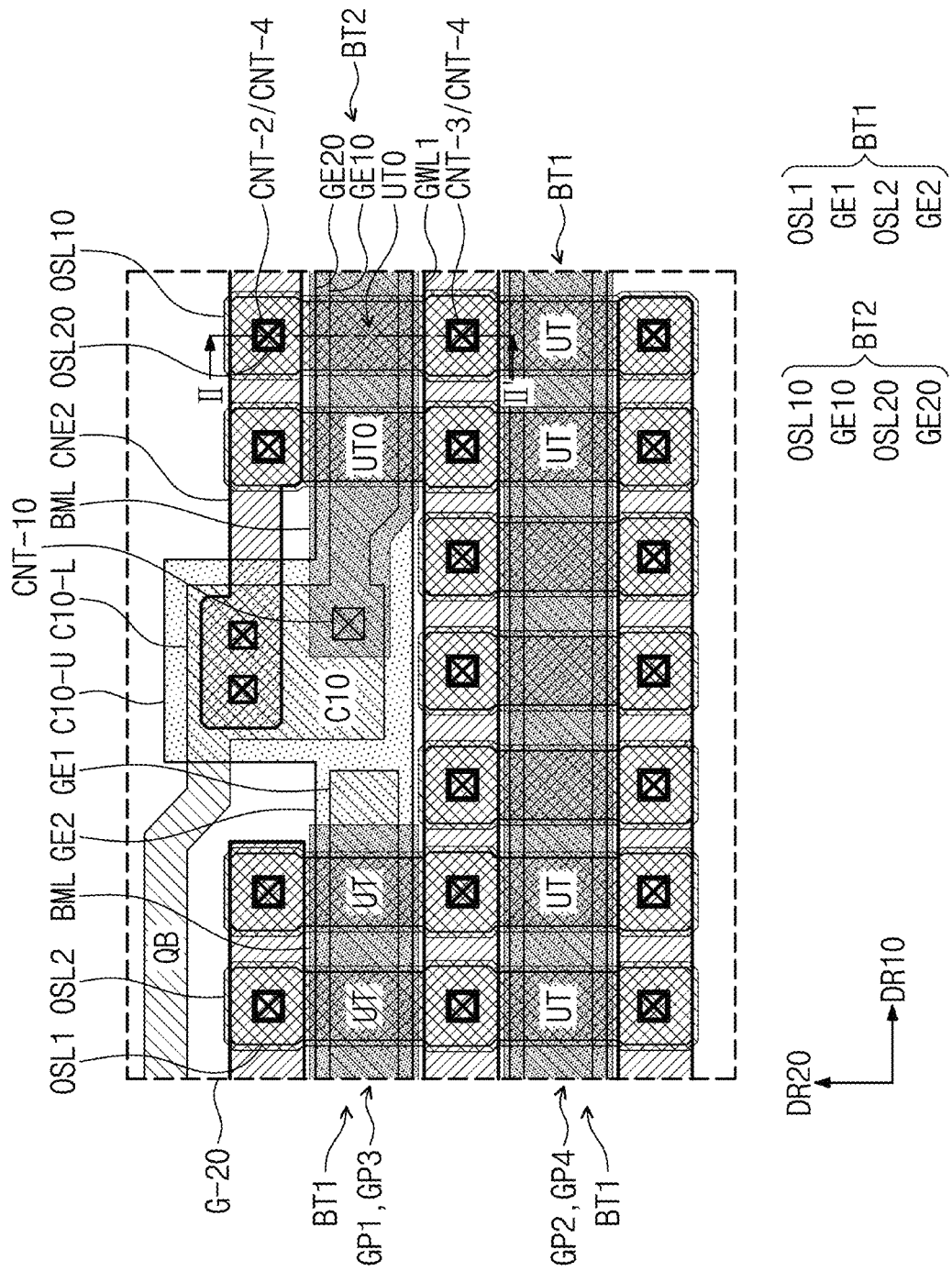

DISPLAY PANEL

CROSS-REFERENCE TO RELATED APPLICATION(S)

This application claims priority to and benefits of Korean Patent Application No. 10-2022-0099729 under 35 U.S.C. § 119, filed on Aug. 10, 2022, the entire contents of which are incorporated hereby by reference.

BACKGROUND

1. Technical Field

Embodiments relate to a display panel including a non-display region having a small size.

2. Description of the Related Art

A display panel may include pixels disposed in a display region. The display panel may include a gate driving circuit that is disposed in a non-display region and drives the plurality of pixels. The gate driving circuit may include a light emission driving circuit and a scan driving circuit. The gate driving circuit may be formed by a process of manufacturing a driving circuit of pixels.

SUMMARY

Embodiments provide a display panel capable of reducing a non-display region by including a scan driving circuit with a reduced occupancy area.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display panel may include a base layer including a display region and a non-display region disposed adjacent to the display region, a plurality of insulation layers disposed on the non-display region of the base layer, a pixel circuit disposed on the display region of the base layer, a light emitting element disposed on the display region of the base layer, and electrically connected to the pixel circuit, and a scan driving circuit disposed on the non-display region of the base layer, and including a first transistor that outputs a high-voltage of a scan signal during a turn-on period of the first transistor. The first transistor may include a first semiconductor pattern layer including a first input region, a first output region, and a first channel region disposed between the first input region and the first output region, a first gate electrode disposed on the first semiconductor pattern layer, and overlapping the first channel region, a second semiconductor pattern layer disposed on the first gate electrode and including a second input region electrically connected to the first input region, a second output region electrically connected to the first output region, and a second channel region disposed between the second input region and the second output region and overlapping the first channel region, and a second gate electrode disposed on the second semiconductor pattern layer, overlapping the second channel region, and electrically connected to the first gate electrode.

In an embodiment, the display panel may further include a shielding electrode disposed on a lower side of the first semiconductor pattern layer, and overlapping the first gate electrode.

In an embodiment, the plurality of insulation layers may include a first insulation layer disposed between the first channel region and the first gate electrode, a second insulation layer disposed between the first gate electrode and the second semiconductor pattern layer, a third insulation layer disposed between the second channel region and the second gate electrode, and a fourth insulation layer covering the second gate electrode and disposed on the third insulation layer.

In an embodiment, the second input region of the second semiconductor pattern layer may be connected to the first input region of the first semiconductor pattern layer through a first contact-hole passing through the second insulation layer, and the second output region of the second semiconductor pattern layer may be connected to the first output region of the first semiconductor pattern layer through a second contact-hole passing through the second insulation layer.

In an embodiment, the display panel may further include a first conductive pattern layer connected to the second input region of the second semiconductor pattern layer through a third contact-hole passing through the fourth insulation layer to provide a clock signal to the first input region of the first semiconductor pattern layer and the second input region of the second semiconductor pattern layer, and a scan signal line connected to the second output region through a fourth contact-hole passing through the fourth insulation layer to receive the high-voltage of the scan signal during the turn-on period of the first transistor.

In an embodiment, the scan driving circuit may be disposed in the non-display region of the base layer, and may further include a second transistor that outputs a low-voltage of the scan signal during a turn-on period of the second transistor.

In an embodiment, the second transistor may include a third semiconductor pattern layer including a third input region, a third output region, and a third channel region disposed between the third input region and the third output region, a third gate electrode disposed on the third semiconductor pattern layer, and overlapping the third channel region, a fourth semiconductor pattern layer disposed on the third gate electrode and including a fourth input region electrically connected to the third input region, a fourth output region electrically connected to the third output region, and a fourth channel region disposed between the fourth input region and the fourth output region and overlapping the third channel region, and a fourth gate electrode disposed on the fourth semiconductor pattern layer, overlapping the fourth channel region, and electrically connected to the third gate electrode.

In an embodiment, the first semiconductor pattern layer and the third semiconductor pattern layer may be disposed on a same layer, and may include a same oxide semiconductor, and the second semiconductor pattern layer and the fourth semiconductor pattern layer may be disposed on a same layer, and may include a same oxide semiconductor.

In an embodiment, the display panel may further include a second conductive pattern layer connected to the fourth input region of the fourth semiconductor pattern layer to provide a reference low-voltage corresponding to the low-voltage of the scan signal to the fourth input region of the fourth semiconductor pattern layer, and a scan signal line connected to the fourth output region of the fourth semiconductor pattern layer to receive the low-voltage of the scan signal during the turn-on period of the second transistor.

In an embodiment, the pixel circuit may include a first-type transistor including a semiconductor pattern layer disposed on a same layer as a layer on which the first semiconductor pattern layer is disposed, and including a same oxide semiconductor, and a second-type transistor including a semiconductor pattern layer disposed on a same layer as a layer on which the second semiconductor pattern layer is disposed, and including a same oxide semiconductor. In an embodiment, at least one of the first-type transistor and the second-type transistor may be configured to receive the scan signal.

In an embodiment, the plurality of insulation layers may include a first insulation layer disposed between the first channel region and the first gate electrode, a second insulation layer disposed between the first gate electrode and the second semiconductor pattern layer, and a third insulation layer disposed between the second semiconductor pattern layer and the second gate electrode.

In an embodiment, the second input region of the second semiconductor pattern layer may be connected to the first input region of the first semiconductor pattern layer through a first contact-hole passing through the second insulation layer, and the second output region of the second semiconductor pattern layer may be connected to the first output region of the first semiconductor pattern layer through a second contact-hole passing through the second insulation layer.

In an embodiment, the display panel may further include a first conductive pattern layer connected to the second input region of the second semiconductor pattern layer through a third contact-hole passing through the third insulation layer to provide a clock signal to the first input region of the first semiconductor pattern layer and the second input region of the second semiconductor pattern layer, and a scan signal line connected to the second output region of the second semiconductor pattern layer through a fourth contact-hole passing through the third insulation layer to receive the high-voltage of the scan signal during the turn-on period of the first transistor.

In an embodiment, the second gate electrode and the first conductive pattern layer may be disposed on the same layer, and may include the same material.

An embodiment provides a display panel comprising a base layer including a display region and a non-display region disposed adjacent to the display region, a plurality of insulation layers disposed on the non-display region of the base layer, a pixel circuit disposed on the display region of the base layer, a light emitting element disposed on the display region of the base layer, and electrically connected to the pixel circuit, and a scan driving circuit disposed on the non-display region of the base layer, and including a first transistor that outputs a high-voltage of a scan signal during a turn-on period of the first transistor and a second transistor that outputs a low-voltage of the scan signal during a turn-on period of the second transistor. The first transistor may include a plurality of first semiconductor pattern layers extending in a first direction and arranged in a second direction intersecting the first direction. Each of plurality of first semiconductor pattern layers may include a first input region, a first output region, a first channel region disposed between the first input region and the first output region, a 1-1 input region, and a 1-1 channel region disposed between the 1-1 input region and the first output region, a first gate electrode disposed on the plurality of first semiconductor pattern layers, and including a first portion overlapping the first channel region of each of the plurality of first semiconductor pattern layers and a second portion overlapping the 1-1 channel region of each of the plurality of first semiconductor pattern layers, a plurality of second semiconductor pattern layers disposed to correspond to the plurality of first semiconductor pattern layers, each of plurality of second semiconductor pattern layers including a second input region electrically connected to the first input region, a second output region electrically connected to the first output region, a second channel region disposed between the second input region and the second output region and overlapping the first channel region, a 2-1 input region electrically connected to the 1-1 input region, and a 2-1 channel region disposed between the 2-1 input region and the second output region and overlapping the 1-1 channel region, and a second gate electrode disposed on the plurality of second semiconductor pattern layers, and including a third portion overlapping the second channel region of each of the plurality of second semiconductor pattern layers and a fourth portion overlapping the 2-1 channel region of each of the plurality of second semiconductor pattern layers.

In an embodiment, the plurality of insulation layers may include a first insulation layer disposed between the first channel region of each of the plurality of first semiconductor pattern layers and the first portion and between the 1-1 channel region and the second portion, a second insulation layer disposed between the first gate electrode and the plurality of second semiconductor pattern layers, a third insulation layer disposed between the second channel region of each of the plurality of second semiconductor pattern layers and the third portion and between the 2-1 channel region and the fourth portion, and a fourth insulation layer covering the second gate electrode and disposed on the third insulation layer.

In an embodiment, the second input region of each of the plurality of second semiconductor pattern layers may be connected to the first input region of a corresponding first semiconductor pattern layer among the plurality of first semiconductor pattern layers through a first contact-hole passing through the second insulation layer, the second output region of each of the plurality of second semiconductor pattern layers may be connected to the first output region of the corresponding first semiconductor pattern layer through a second contact-hole passing through the second insulation layer, and the 2-1 input region of each of the plurality of second semiconductor pattern layers may be connected to the 1-1 input region of the corresponding first semiconductor pattern layer through a 1-1 contact-hole passing through the second insulation layer.

In an embodiment, the display panel may further include a first conductive pattern layer including a first conductive pattern portion connected to the second input region of a corresponding second semiconductor pattern layer among the plurality of second semiconductor pattern layers through a third contact-hole passing through the fourth insulation layer to provide a clock signal to the second input region and a second conductive pattern portion connected to the 2-1 input region of a corresponding second semiconductor pattern layer among the plurality of second semiconductor pattern layers through a 3-1 contact-hole passing through the fourth insulation layer to provide the clock signal to the 2-1 input region, and a scan signal line connected to the second output region of a corresponding second semiconductor pattern layer among the plurality of second semiconductor pattern layers through a fourth contact-hole passing through the fourth insulating layer to receive the high-voltage of the scan signal during the turn-on period of the first transistor.

In an embodiment, in the first direction, the scan signal line may be disposed between the first conductive pattern portion and the second conductive pattern portion.

In an embodiment, in the second direction, a length of the first conductive pattern portion may be less than a length of the second conductive pattern portion.

In an embodiment, the second transistor may include a plurality of third semiconductor pattern layers, each of plurality of third semiconductor pattern layers may include a third input region, a third output region, and a third channel region disposed between the third input region and the third output region, a third gate electrode disposed on the plurality of third semiconductor pattern layers, and overlapping the third channel region of each of the plurality of third semiconductor pattern layers, a fourth semiconductor pattern layer disposed on the third gate electrode and including a fourth input region electrically connected to the third input region, a fourth output region electrically connected to the third output region, a fourth channel region disposed between the fourth input region and the fourth output region and overlapping the third channel region, and a fourth gate electrode disposed on the fourth semiconductor pattern layer, overlapping the fourth channel region of the fourth semiconductor pattern layer, and electrically connected to the third gate electrode.

In an embodiment, the plurality of first semiconductor pattern layers and the plurality of third semiconductor pattern layers may be disposed on a same layer, and may include a same oxide semiconductor, and the plurality of second semiconductor pattern layers and the fourth semiconductor pattern layer may be disposed on a same layer, and may include a same oxide semiconductor.

In an embodiment, the display panel may further include a second conductive pattern layer connected to the fourth input region to provide a reference low-voltage corresponding to the low-voltage of the scan signal to the fourth input region.

In an embodiment, the scan signal line may be connected to the fourth output region to receive the low-voltage of the scan signal during the turn-on period of the second transistor.

In an embodiment, the second portion of the first gate electrode, the fourth portion of the second gate electrode, and the second conductive pattern portion of the first conductive pattern layer may be extended along the scan signal line, each of the plurality of third semiconductor pattern layers may further include a 1-1 input region and a 1-1 channel region disposed between the 1-1 input region and the third output region, the fourth semiconductor pattern layer may further include a 2-1 input region and a 2-1 channel region disposed between the 2-1 input region and the fourth output region, the second portion of the first gate electrode may overlap the 1-1 channel region of each of the plurality of third semiconductor pattern layers, the fourth portion of the second gate electrode may overlap the 2-1 channel region of the fourth semiconductor pattern layer, and the second conductive pattern portion of the first conductive pattern layer may be electrically connected to the 2-1 input region of the fourth semiconductor pattern layer.

BRIEF DESCRIPTION OF THE DRAWINGS

The accompanying drawings are included to provide a further understanding of the invention, and are incorporated in and constitute a part of this specification. The drawings illustrate embodiments and, together with the description, serve to explain principles of the invention. In the drawings:

FIG. 8C is a schematic plan view illustrating an enlarged second region of FIG. 6;

DETAILED DESCRIPTION OF THE EMBODIMENTS

Figure 1:
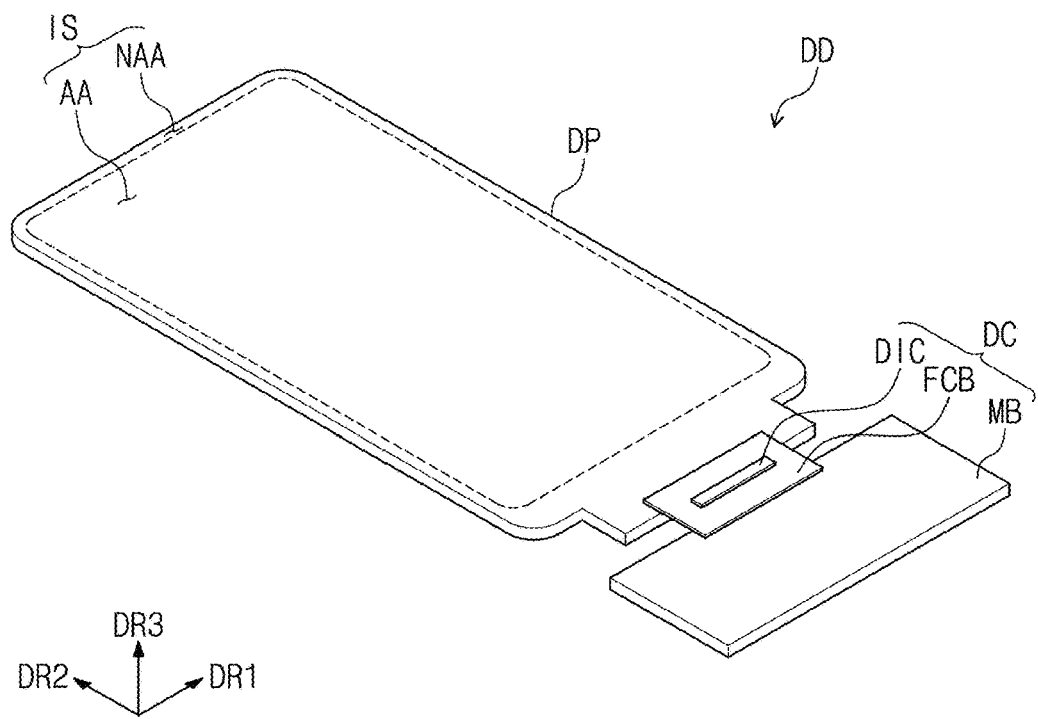
FIG. 1 is a schematic perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments will be described with reference to the accompanying drawings.

Figure 2:
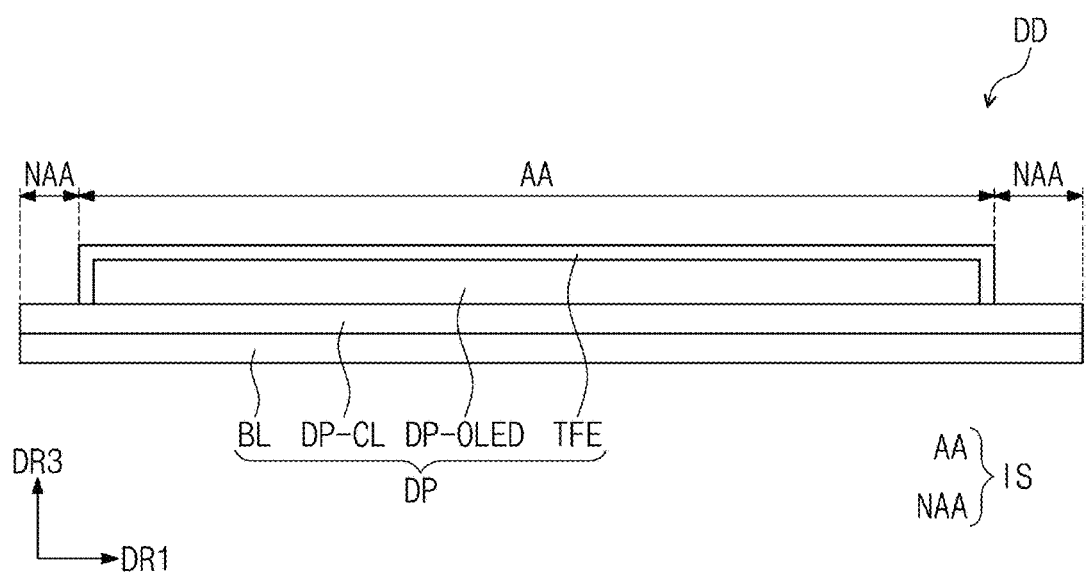
FIG. 2 is a schematic cross-sectional view of a display panel according to an embodiment.

FIG. 1 is a schematic perspective view showing a display device DD according to an embodiment. FIG. 2 is a schematic cross-sectional view of a display panel DP according to an embodiment.

Referring to FIG. 1, the display device DD may be a device activated according to an electrical signal. The display device DD may be used in large electronic devices such as televisions, as well as in small and medium-sized electronic devices and the like such as monitors, laptops, and cell phones. In an embodiment, the display device DD is illustrated as a smart phone.

The display device DD may display images though a display surface IS parallel to a plane defined by a first direction DR1 and a second direction DR2 which are perpendicular to each other. In an embodiment, a front surface (or an upper surface) and a rear surface (or a lower surface) of each member are defined based on a third direction DR3 which is a normal direction of the display surface IS. Upper surface (front surface) and lower surfaces (rear surfaces) of members to be described below are distinguished by the third direction DR3. However, directions indicated by the first to third directions DR1, DR2, and DR3 may be converted to different directions different from those defined in FIG. 1.

The display device DD may include the display panel DP and a driving circuit unit DC. For example, the display device DD may further include an input sensor disposed on the display panel DP.

Referring to FIG. 2, the display panel DP may include a base layer BL, a circuit layer DP-CL, a display element layer DP-OLED, and an encapsulation layer TFE.

The base layer BL may include a synthetic resin layer. The synthetic resin layer may be a polyimide-based resin layer, and the material thereof is not limited thereto. The base layer BL may include a first synthetic resin layer, an inorganic layer, and a second synthetic resin layer, which are sequentially laminated.

The circuit layer DP-CL may be disposed on the base layer BL. The circuit layer DP-CL may include at least one insulation layer and a circuit element. The circuit element may include a signal line, a driving circuit of a pixel (hereinafter, a pixel circuit), and the like. The circuit layer DP-CL may be formed by a forming process of an insulation layer, a semiconductor layer, and a conductive layer by coating, deposition, and the like, and a patterning process of the insulation layer, the semiconductor layer, and the conductive layer by a photolithography process.

The display element layer DP-OLED may include a light emitting element and a pixel definition film. The encapsulation layer TFE may encapsulate the display element layer DP-OLED. The encapsulation layer TFE may include at least one organic film and at least one inorganic film. The inorganic film may protect the display element layer DP-OLED from moisture/oxygen. The inorganic film may include a silicon nitride layer, a silicon oxynitride layer, a silicon oxide layer, a titanium oxide layer, or an aluminum oxide layer, and the like, but embodiments are not limited thereto.

Referring to FIG. 1 and FIG. 2, the display surface IS may include a display region AA in which images are displayed and a non-display region NAA in which images are not displayed. In the display region AA, a pixel may be disposed, and in the non-display region NAA, a gate driving circuit may be disposed.

Referring to FIG. 1, the driving circuit unit DC may be electrically connected to the display panel DP. The driving circuit unit DC may include a main circuit board MB, a flexible circuit board FCB, and a driving chip DIC.

The main circuit board MB may include various driving circuits for driving the display panel DP, connectors for supplying power, or the like. The flexible circuit board FCB may electrically connect the main circuit board MB and the display panel DP. The driving chip DIC may include a data driving circuit. In an embodiment, the driving chip DIC may be mounted on the flexible circuit board FCB, but embodiments are not limited thereto, and the driving chip DIC may be mounted on the display panel DP.

Figure 3A:
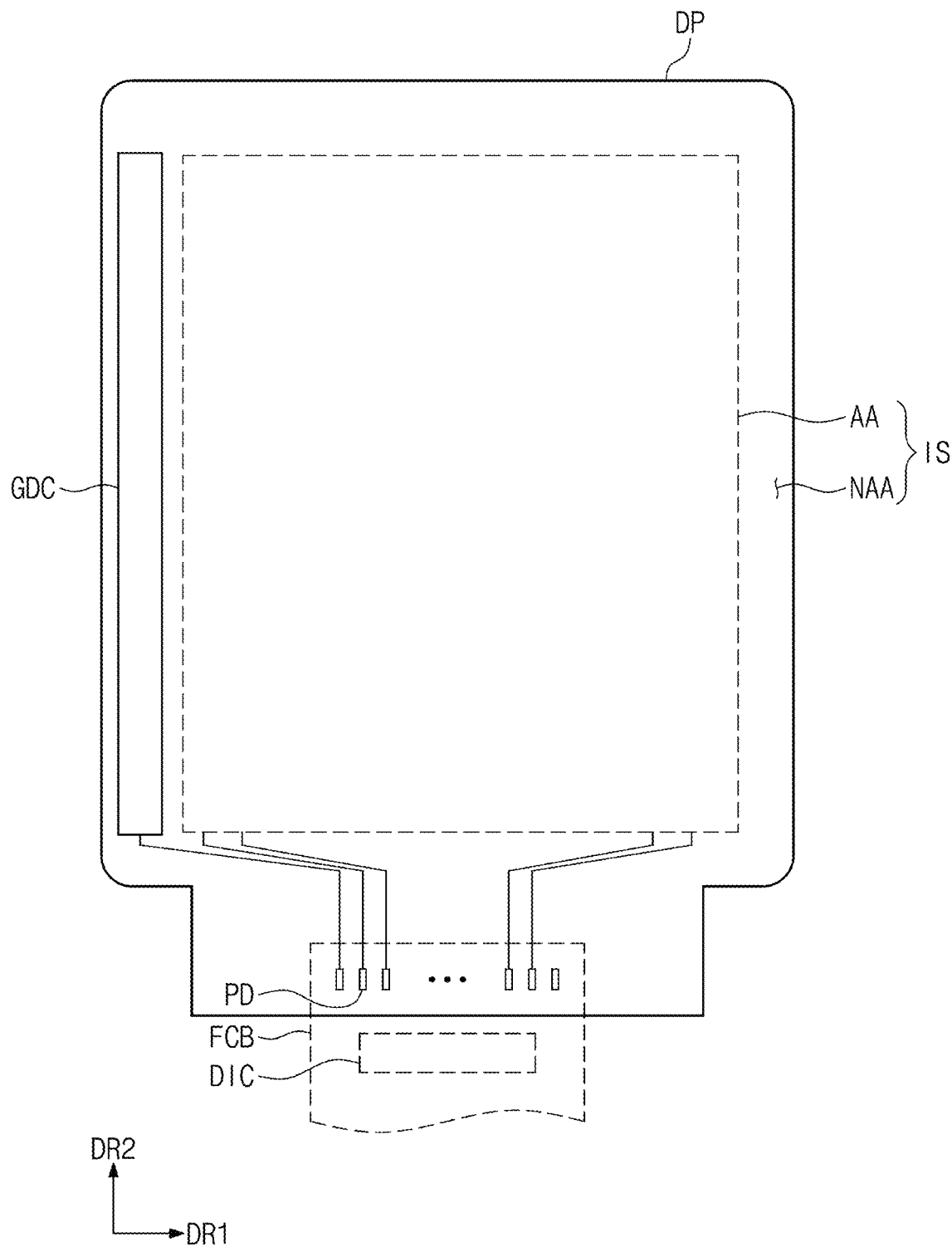
FIG. 3A is a schematic plan view of a display panel according to an embodiment.
Figure 3B:
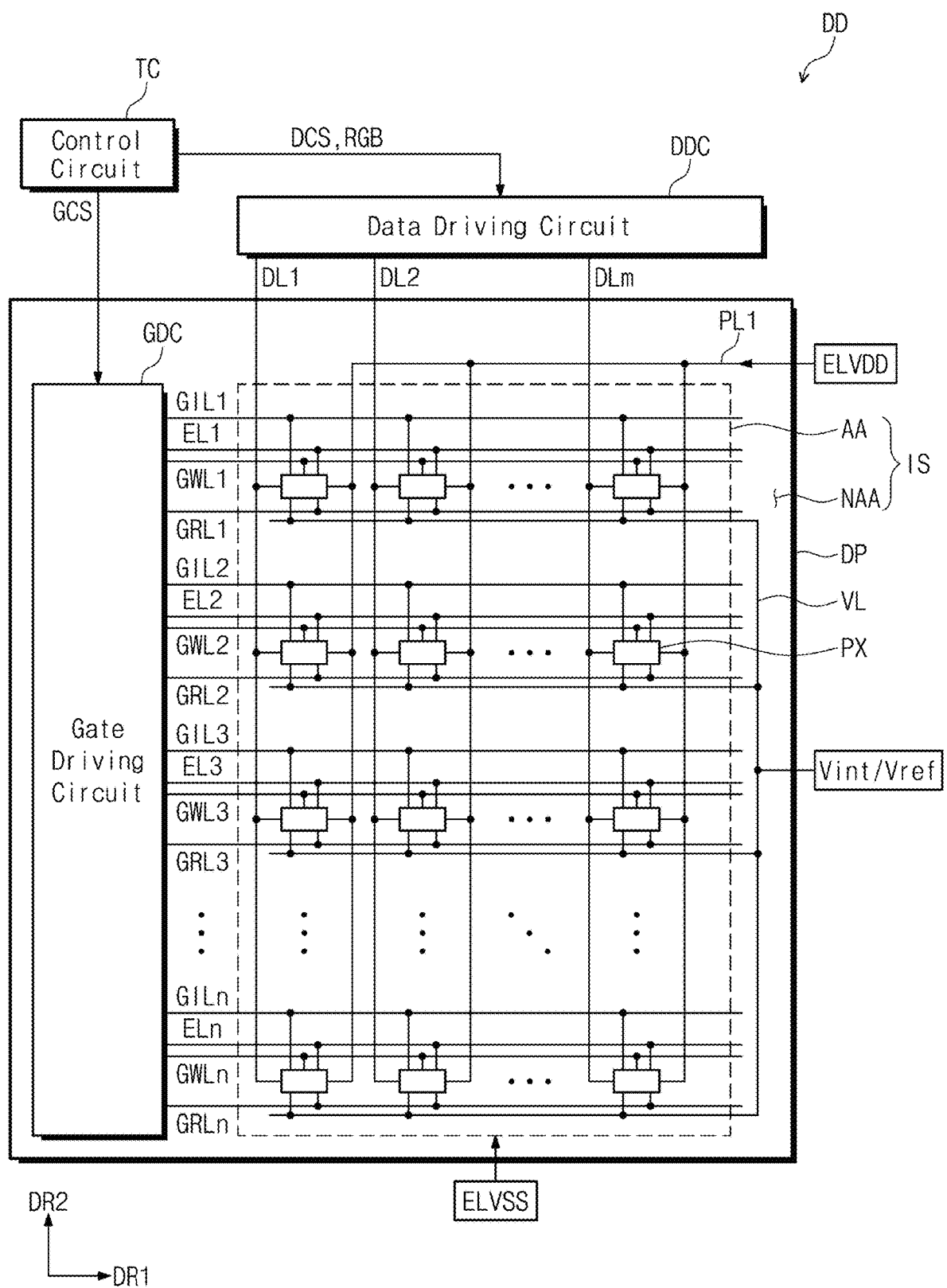
FIG. 3B is a block diagram of a display device according to an embodiment.

FIG. 3A is a schematic plan view of the display panel DP according to an embodiment. FIG. 3B is a block diagram of the display device DD according to an embodiment.

Referring to FIG. 3A and FIG. 3B, the display panel DP may include the display region AA in which images are displayed and the non-display region NAA disposed on an outer side of the display region AA. In the display region AA, pixels PX may be disposed. In the non-display region NAA, a gate driving circuit GDC for driving the pixels PX may be disposed.

The gate driving circuit GDC may be formed (e.g., directly formed) on the base layer BL (see FIG. 2) through a photolithography process. The gate driving circuit GDC may be formed by a process of forming a pixel circuit of the pixels PX. Pads PD disposed on the non-display region NAA of the display panel DP may be connected (e.g., electrically connected) to the flexible circuit board FCB.

Referring to FIG. 3B, the display device DD may include the display panel DP, the gate driving circuit GDC, a data driving circuit DDC, and a control circuit TC.

The control circuit TC may control the gate driving circuit GDC and the data driving circuit DDC. The control circuit TC may covert the data format of input image signals to match interface specifications with the data driving circuit DDC, thereby generating image data RGB. The control circuit TC may output the image data RGB, and various control signals DCS and GCS.

The gate driving circuit GDC may receive a first control signal GCS from the control circuit TC. The first control signal GCS may include a vertical start signal which starts the operation of the gate driving circuit GDC, a clock signal which determines the output timing of signals, and the like. The gate driving circuit GDC may output scan signals to scan lines GWL1 to GWLn, GRL1 to GRLn, and GIL1 to GILn which are to be described below. For example, the gate driving circuit GDC may generate light emission control signals, and may output the same to light emission signal lines EL1 to ELn.

The data driving circuit DDC may receive a second control signal DCS and the image data RGB from the control circuit TC. The data driving circuit DDC may convert the image data RGB into data signals, and may output the data signals to data lines DL1 to DLm to be described below. The data signals may be analog voltages corresponding to a gray scale value of the image data RGB. The data driving circuit DDC may constitute the driving chip DIC illustrated in FIG. 1.

The display panel DP may include the scan lines GWL1 to GWLn, GRL1 to GRLn, and GIL1 to GILn, the light emission signal lines EL1 to ELn, the data lines DL1 to DLm, and the pixels PX. The scan lines GWL1 to GWLn, GRL1 to GRLn, and GIL1 to GILn may be extended in the first direction DR1, and may be arranged in the second direction DR2 perpendicular to the first direction DR1. Each of the light emission signal lines EL1 to ELn may be arranged parallel to a corresponding scan line among the scan lines GWL1 to GWLn, GRL1 to GRLn, and GIL1 to GILn. The data lines DL1 to DLm may intersect the scan lines GWL1 to GWLn, GRL1 to GRLn, and GIL1 to GILn and may be insulated therefrom.

Each of the pixels PX may be connected (e.g., electrically connected) to a corresponding scan line among the scan lines GWL1 to GWLn, GRL1 to GRLn, and GIL1 to GILn, a corresponding light emission signal line among the light emission signal lines EL1 to ELn, and a corresponding data line among the data lines DL1 to DLm.

The display panel DP may receive a first power voltage ELVDD and a second power voltage ELVSS. The first power voltage ELVDD may be provided to the pixels PX through a first power line PL1. The second power voltage ELVSS may be provided to the pixels PX through a second power line.

The display panel DP may receive an initialization voltage Vint and a reference voltage Vref. The initialization voltage Vint and the reference voltage Vref may be provided to the pixels PX through a power line VL.

Figure 4A:
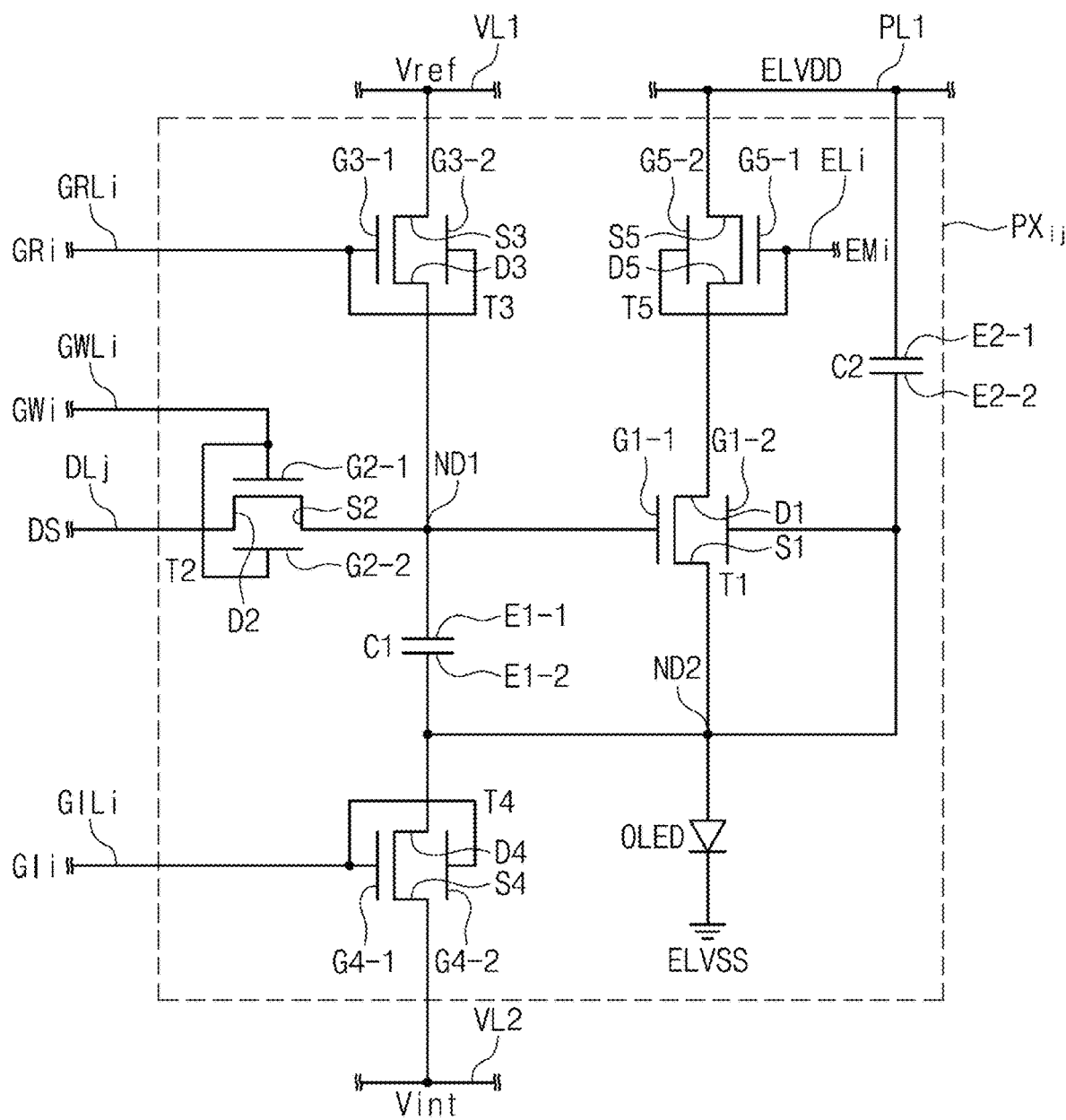
FIG. 4A is a schematic diagram of an equivalent circuit of a pixel according to an embodiment.
Figure 4B:
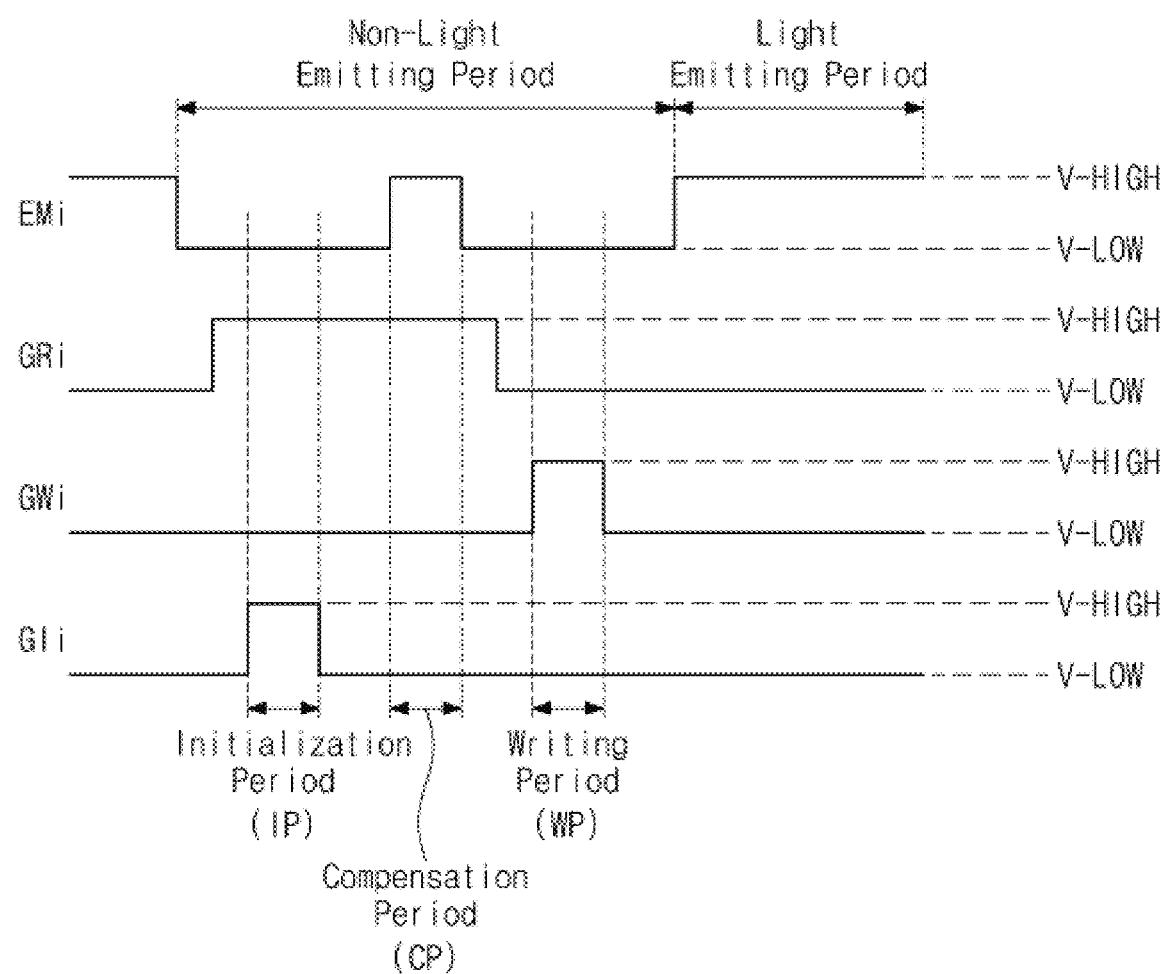
FIG. 4B is a waveform diagram of driving signals for driving the pixel illustrated in FIG. 4A.

FIG. 4A is a schematic diagram of an equivalent circuit of a pixel PXij according to an embodiment. FIG. 4B is a waveform diagram of driving signals for driving the pixel PXij illustrated in FIG. 4A.

In FIG. 4A, a pixel PXij connected (e.g., electrically connected) to an i-th scan line GWLi among scan lines GWL1 to GWLn (see FIG. 3B) of a first group, and connected (e.g., electrically connected) to a j-th data line DLj among the data lines DL1 to DLm (see FIG. 3B) is representatively illustrated. The pixel PXij may be connected (e.g., electrically connected) to an i-th scan line GRLi among scan lines of a second group, and connected (e.g., electrically connected) to an i-th scan line GILi among scan lines of a third group.

In an embodiment, a pixel circuit (or a pixel driving circuit) may include first to fifth transistors (e.g., T1, T2, T3, T4, and T5), a first capacitor C1, and a second capacitor C2. The pixel PXij may include a pixel circuit and the light emitting element OLED which is electrically connected thereto. In an embodiment, the first to fifth transistors T1 to T5 are described as N-type transistors. However, embodiments are not limited thereto, and at least one of the first to fifth transistors T1 to T5 may be a P-type transistor. In another example, at least one of the first to fifth transistors T1 to T5 may be omitted, or an additional transistor may be further included in the pixel PXij.

In an embodiment, each of the first to fifth transistors T1 to T5 is illustrated as including two gates, but at least one transistor may include a single gate. Upper gates G2-1, G3-1, G4-1, and G5-1 and lower gates G2-2, G3-2, G4-2, and G5-2 of respective second to fifth transistors T2 to T5 are illustrated as being connected (e.g., electrically connected) to each other, but embodiments are not limited thereto. The lower gates G2-2, G3-2, G4-2, and G5-2 of the respective second to fifth transistors T2 to T5 may be in a floating state.

In an embodiment, the first transistor T1 may be a driving transistor, and the second transistor T2 may be a switching transistor. A node, to which a first upper gate G1-1 of the first transistor T1 is connected, may be defined as a first node ND1, and a node to which a source S1 of the first transistor T1 is connected may be defined as a second node ND2.

The light emitting element OLED may include a first electrode connected (e.g., electrically connected) to the second node ND2, a second electrode receiving the second power voltage ELVSS, and a light emitting layer disposed between the first electrode and the second electrode. The light emitting element OLED will be described in detail below.

The first transistor T1 may be electrically connected between the first power line PL1 receiving the first power voltage ELVDD and the second node ND2. The first transistor T1 may include a source S1 (hereinafter, a first source) connected (e.g., electrically connected) to the second node ND2, a drain D1 (hereinafter, a first drain), a semiconductor region, and the first upper gate G1-1 connected (e.g., electrically connected) to the second node ND2. The first transistor T1 may further include a first lower gate G1-2 connected (e.g., electrically connected) to the second node ND2.

The second transistor T2 may be electrically connected between the j-th data line DLj and the first node ND1. The second transistor T2 may include a source S2 (hereinafter, a second source) connected (e.g., electrically connected) to the first node ND1, a drain D2 (hereinafter, a second drain) connected (e.g., electrically connected) to the j-th data line DLj, a semiconductor region, and a gate G2-1 (hereinafter, a second upper gate) connected (e.g., electrically connected) to the i-th scan line GWLi of the first group. The second transistor T2 may further include a gate G2-2 (hereinafter, a second lower gate) connected (e.g., electrically connected) to the second upper gate G2-1. The third to fifth transistors T3 to T5 to be described below may include upper gates G3-1, G4-1, and G5-1 and lower gates G3-2, G4-2, and G5-2 corresponding to the second upper gate G2-1 and the second lower gate G2-2.

The third transistor T3 may be electrically connected between the first node ND1 and a first voltage line VL1 receiving the reference voltage Vref. The third transistor T3 may include a drain D3 (hereinafter, a third drain) connected (e.g., electrically connected) to the first node ND1, a source S3 (hereinafter, a third source) connected the first voltage line VL1, a semiconductor region, and a third upper gate G3-1 connected (e.g., electrically connected) to the i-th scan line GRLi of the second group.

The fourth transistor T4 may be electrically connected between a second voltage line VL2 receiving the initialization voltage Vint and the second node ND2. The fourth transistor T4 may include a drain D4 (hereinafter, a fourth drain) connected (e.g., electrically connected) to the second node ND2, a source S4 (hereinafter, a fourth source) connected (e.g., electrically connected) to the second voltage line VL2, a semiconductor region, and a fourth upper gate G4-1 connected i-th scan line GILi of the third group.

The fifth transistor T5 may be electrically connected between the first power line PL1 and the first drain D1 or the first source S1. In an embodiment, the fifth transistor T5 may include a source S5 (hereinafter, a fifth source) connected (e.g., electrically connected) to the first power line PL1, a drain D5 (hereinafter, a fifth drain) connected the first drain D1, a semiconductor region, and a fifth upper gate G5-1 connected (e.g., electrically connected) to an i-th light emission signal line EL1.

The first capacitor C1 may be electrically connected between the first node ND1 and the second node ND2. The first capacitor C1 may include a first electrode E1-1 connected (e.g., electrically connected) to the first node ND1 and a second electrode E1-2 connected (e.g., electrically connected) to the second node ND2.

The second capacitor C2 may be connected between the first power line PL1 and the second node ND2. The second capacitor C2 may include a first electrode E2-1 connected (e.g., electrically connected) to the first power line PL1 and a second electrode E2-2 connected (e.g., electrically connected) to the second node ND2.

Referring to FIG. 4A and FIG. 4B, the operation of the pixel PXij will be described in more detail. The display panel DD (see FIG. 3A and FIG. 3B) may display an image for each frame period. Each of the scan lines of the first group, the scan lines of the second group, the scan lines of the third group, and the light emission signal lines may sequentially receive scan signals or control signals during a frame period. FIG. 4B illustrates a portion of a frame period.

Referring to FIG. 4A and FIG. 4B, each of scan signals EMi, GRi, GWi, GIi may have a high-voltage V-HIGH (or a high-level) during some periods, and may have a low-voltage V-LOW (or a low-level) during some periods. In case that a corresponding scan signal has the high-voltage V-HIGH, the N-type first to fifth transistors T1 to T5 described above may be turned on.

During an initialization period IP, the third transistor T3 and the fourth transistor T4 may be turned on. The first node ND1 may be initialized to the reference voltage Vref. The second node ND2 may be initialized to the initialization voltage Vint. A first capacitor C1 may be initialized to a value corresponding to the difference between the reference voltage Vref and the initialization voltage Vint. The second capacitor C2 may be initialized to a value corresponding to the difference between the second power voltage ELVDD and the initialization voltage Vint.

During a compensation period CP, the third transistor T3 and the fifth transistor T5 may be turned on. A voltage corresponding to a threshold voltage of the first transistor T1 may be stored in the first capacitor C1.

During a write period WP, the second transistor T2 may be turned on. The second transistor T2 may output a voltage corresponding to a data signal DS. As a result, the first capacitor C1 may be charged with a voltage value corresponding to the data signal DS. The first capacitor C1, which is charged with the threshold voltage of the first transistor T1, may be further charged with the data signal DS. Threshold voltages of driving transistors may be different for each pixel PX (see FIG. 3B), but the pixel PXij illustrated in FIG. 4A and described in association with FIG. 4B may supply a current corresponding to the data signal DS to the light emitting element OLED regardless of the deviation of the threshold voltages of the driving transistors.

Thereafter, during a light emitting period, the fifth transistor T5 may be turned on. The first transistor T1 may provide a current to the light emitting element OLED, the current corresponding to a value of a voltage stored in the first capacitor C1. The light emitting element OLED may emit light to a luminance corresponding to the data signal DS.

Figure 5A:
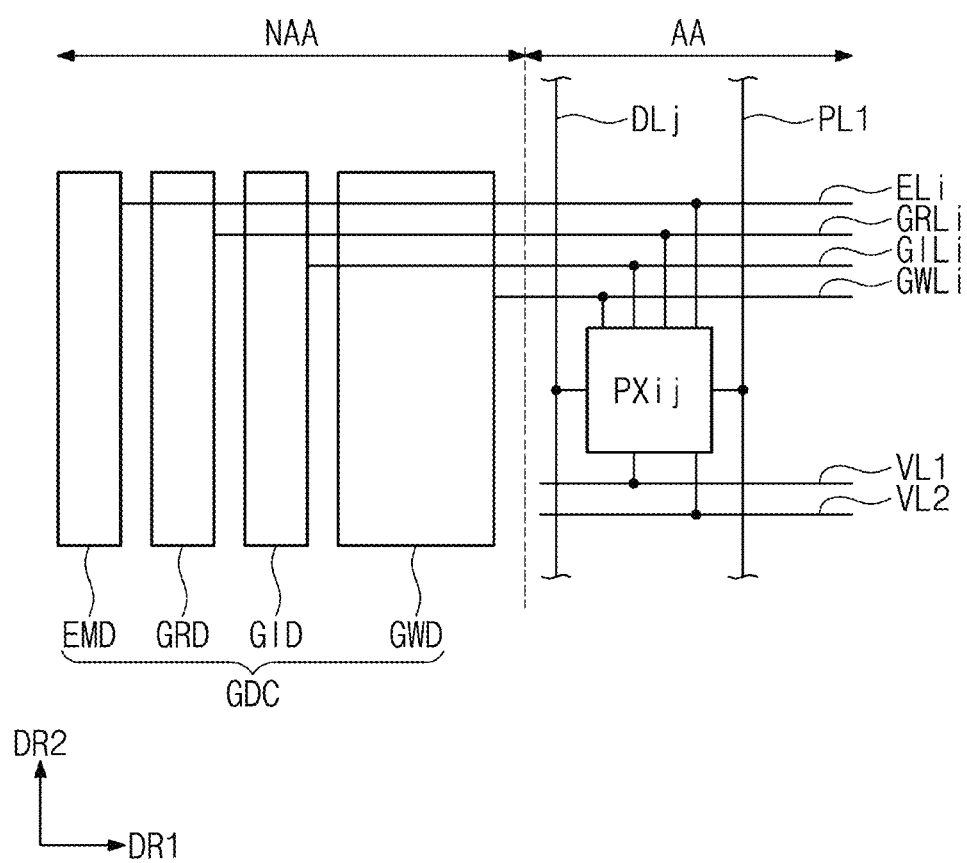
FIG. 5A is a block diagram of a gate driving circuit according to an embodiment.
Figure 5B:
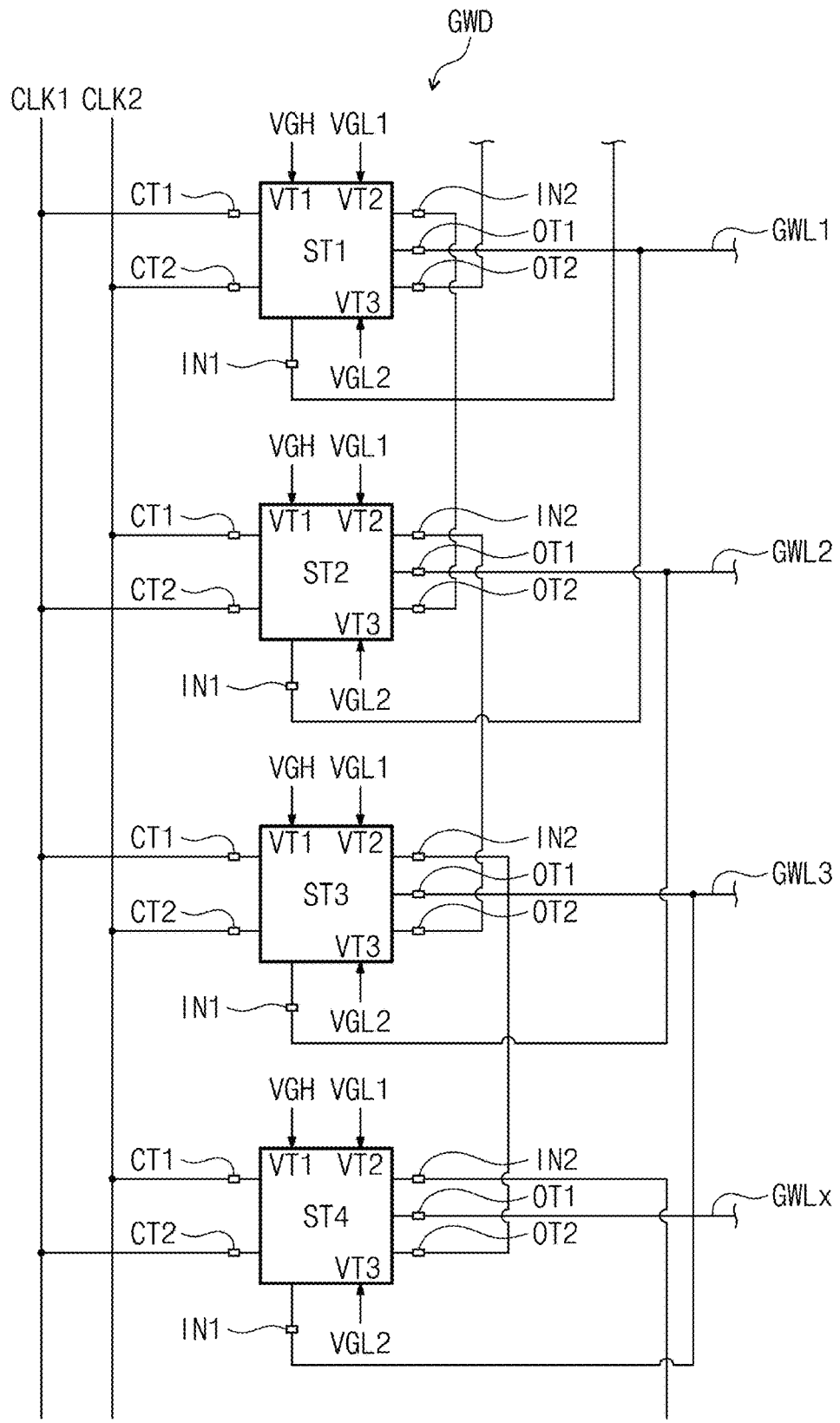
FIG. 5B is a block diagram of a scan driving circuit according to an embodiment.
Figure 5C:
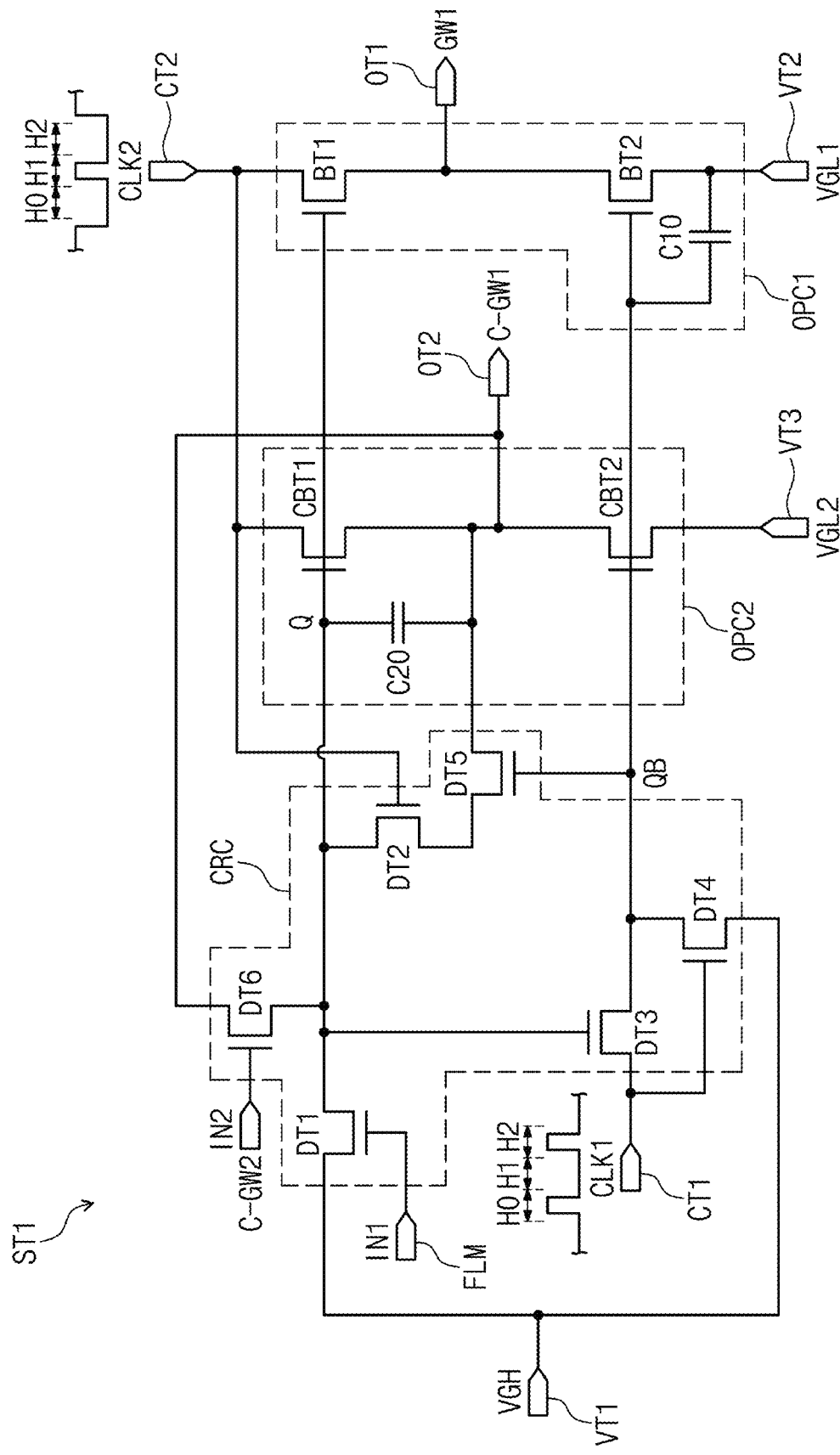
FIG. 5C is a schematic diagram of an equivalent circuit of a first stage illustrated in FIG. 5B.

FIG. 5A is a block diagram of the gate driving circuit GDC according to an embodiment. FIG. 5B is a block diagram of a scan driving circuit GWD according to an embodiment. FIG. 5C is a schematic diagram of an equivalent circuit of a first stage ST1 illustrated in FIG. 5B.

As illustrated in FIG. 5A, the gate driving circuit GDC may include a light emission control circuit EMD, a first scan driving circuit GWD, a second scan driving circuit GRD, and a third scan driving circuit GID. The light emission control circuit EMD, the first scan driving circuit GWD, the second scan driving circuit GRD, and the third scan driving circuit GID may be disposed in the non-display region NAA. The arrangement order of the light emission control circuit EMD, the first scan driving circuit GWD, the second scan driving circuit GRD, and the third scan driving circuit GID in the first direction DR1 illustrated in FIG. 5A is merely an example, and embodiments are not limited thereto.

The light emission control circuit EMD may be connected (e.g., electrically connected) to the light emission signal lines EL1 to ELn (see FIG. 3B), and in FIG. 5A, the i-th light emission signal line EL1 is illustrated. In FIG. 5A, the i-th scan line GWLi of the first group connected (e.g., electrically connected) to the first scan driving circuit GWD, the i-th scan line GRLi of the second group connected (e.g., electrically connected) to the second scan driving circuit GRD, and the i-th scan line GILi of the third group connected (e.g., electrically connected) to the third scan driving circuit GID are illustrated. For example, the pixel PXij connected (e.g., electrically connected) to the i-th scan line GWLi of the first group and to the j-th data line DLj is illustrated.

Referring to FIG. 5B, the first scan driving circuit GWD is illustrated. The first scan driving circuit GWD may include stages ST1 to ST4 connected each other. The stages ST1 to ST4 may have substantially the same circuit configuration. In FIG. 5B, four stages ST1 to ST4 are illustrated, but the first scan driving circuit GWD may include stages respectively corresponding to the scan lines GWL1 to GWLn of the first group illustrated in FIG. 3B.

Each of the stages ST1 to ST4 may include a first input terminal IN1, a second input terminal IN2, a first control terminal CT1, a second control terminal CT2, a first output terminal OT1, and a second output terminal OT2. For example, each of the stages ST1 to ST4 may include first to third voltage terminals VT1 to VT3.

The first input terminal IN1 may receive a scan signal output from the first output terminal OT1 of a previous stage or a start signal FLM. The start signal FLM may be output from a dummy stage before the first stage ST1. The second input terminal IN2 may receive a carry signal output from the second output terminal OT2 of a following stage.

Each of the stages ST1 to ST4 may receive first and second clock signals CLK1 and CLK2 through the first and second control terminals CT1 and CT2. The first control terminal CT1 of odd-numbered stages ST1 and ST3 among the stages ST1 to ST4 may receive the first clock signal CLK1, and the second control terminal CT2 thereof may receive the second clock signal CLK2. For example, the first control terminal CT1 of even-numbered stages ST2 and ST4 may receive the second clock signal CLK2, and the second control terminal CT2 thereof may receive the first clock signal CLK1. The first clock signal CLK1 and the second clock signal CLK2 may have the same cycle, and may have different phases. As an example, the second clock signal CLK2 may have a phase inverted from the first clock signal CLK1.

The first voltage terminal VT1, the second voltage terminal VT2, and the third voltage terminal VT3 may respectively receive a high-voltage VGH, a first low-voltage VGL1, and a second low-voltage VGL2. Each of the high-voltage VGH, the first low-voltage VGL1, and the second low-voltage VGL2 may have a direct-current voltage level.

The high-voltage VGH may be set as a high-level of a scan signal, e.g., a gate-on voltage, and the first low-voltage VGL1 may be set as a low-level of a scan signal, e.g., a gate-off voltage. The second low-voltage VGL2 may be a bias voltage having a different level from the first low-voltage VGL1. The stages ST1 to ST4 may sequentially output scan signals to scan lines GWL1 to GWL4 of the first group.

Hereinafter, referring to FIG. 5C, the circuit configuration of the first stage ST1 among the stages ST1 to ST4 will be described. Since each of the stages ST1 to ST4 have the same circuit configuration, the description of circuit configuration of the rest of the stages ST2 to ST4 will be omitted.

Referring to FIG. 5C, the first stage ST1 may include a first output unit OPC1, a second output unit OPC2, and a control unit CRC. The first output unit OPC1 may include a first buffer transistor BT1, a second buffer transistor BT2, and the first capacitor C10. The second output unit OPC2 may include a first carry transistor CBT1, a second carry transistor CBT2, and the second capacitor C20. The control unit CRC may include first to sixth control transistors DT1 to DT6.

Based on three horizontal periods H0, H1, and H2, the operation of the first stage ST1 will be described. During a corresponding horizontal period, the first stage ST1 may output a corresponding scan signal GW1 and a corresponding carry signal C-GW1.

During a previous horizontal period H0, the start signal FLM may be applied to the first input terminal IN1 to turn on the first control transistor DT1. The high-voltage VGH applied to the first voltage terminal VT1 may be provided to a first node Q. During the previous horizontal period H0, the fourth control transistor DT4 may be turned on by the first clock signal CLK1 having a high-level. The high-voltage VGH applied to the first voltage terminal VT1 may be provided to a second node QB. The fourth control transistor DT4 and the second carry transistor CBT2 may be turned on. At this time, since the second control transistor DT2 is turned off by the second clock signal CLK2 having a low-level during the previous horizontal period H0, a second capacitor C20 may charge a voltage corresponding to the difference between the high-voltage VGH and the second low-voltage VGL2. During the previous horizontal period H0, the first buffer transistor BT1, the second buffer transistor BT2, the first carry transistor CBT1, and the second carry transistor CBT2 may be turned on, and the first low-voltage VGL1 and the second low-voltage VGL2 may be respectively provided to the first output terminal OT1 and the second output terminal OT2.

The second capacitor C20 may maintain the potential of the first node Q to a corresponding horizontal period H1. Therefore, during the corresponding horizontal period H1, the first buffer transistor BT1 and the first carry transistor CBT1 may be turned on. The corresponding horizontal period H1 may be a turn-on period of the first buffer transistor BT1 and the first carry transistor CBT1. A high-voltage of the second clock signal CLK2 may be provided to the first output terminal OT1 and the second output terminal OT2. The high-voltage of the second clock signal CLK2 may be the same as the high-voltage V-HIGH of the scan signal GWi described with reference to FIG. 4B.

Since the start signal FLM has a low-level during a following horizontal period H2, the first control transistor DT1 may be turned off. During the following horizontal period H2, the fourth control transistor DT4 may be turned on by the first clock signal CLK1 having a high-level. The high-voltage VGH applied to the first voltage terminal VT1 may be provided to the second node QB. At this time, the second buffer transistor BT2 and the second carry transistor CBT2 may be turned on. The following horizontal period H2 may be a turn-on period of the second buffer transistor BT2 and the second carry transistor CBT2.

The first low-voltage VGL1 and the second low-voltage VGL2 may be respectively provided to the first output terminal OT1 and the second output terminal OT2. The first low-voltage VGL1 provided to the first output terminal OT1 may be the same as the low-voltage V-LOW of the scan signal GWi described with reference to FIG. 4B.

For example, the sixth control transistor DT6 which has received a carry signal C-GW2 from the second stage ST2 (see FIG. 5B) may be turned on. The sixth control transistor DT6 may provide the second low-voltage VGL2 to the first node Q. The first buffer transistor BT1 and the second carry transistor CBT2 may be turned off.

Figure 6:
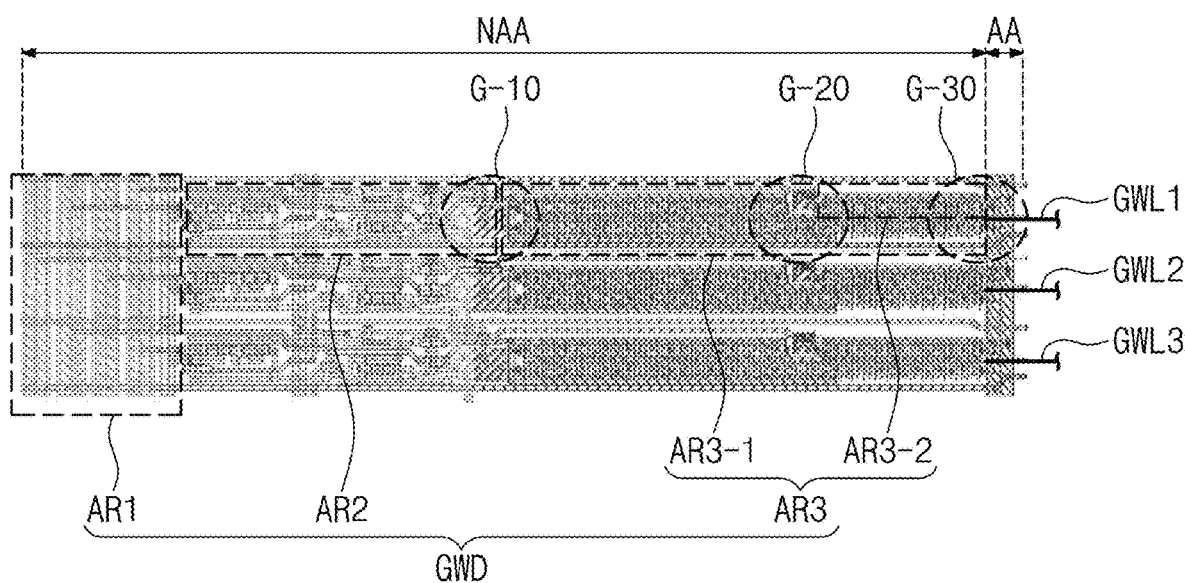
FIG. 6 is a schematic plan view illustrating a layout of a scan driving circuit according to an embodiment.
Figure 7:
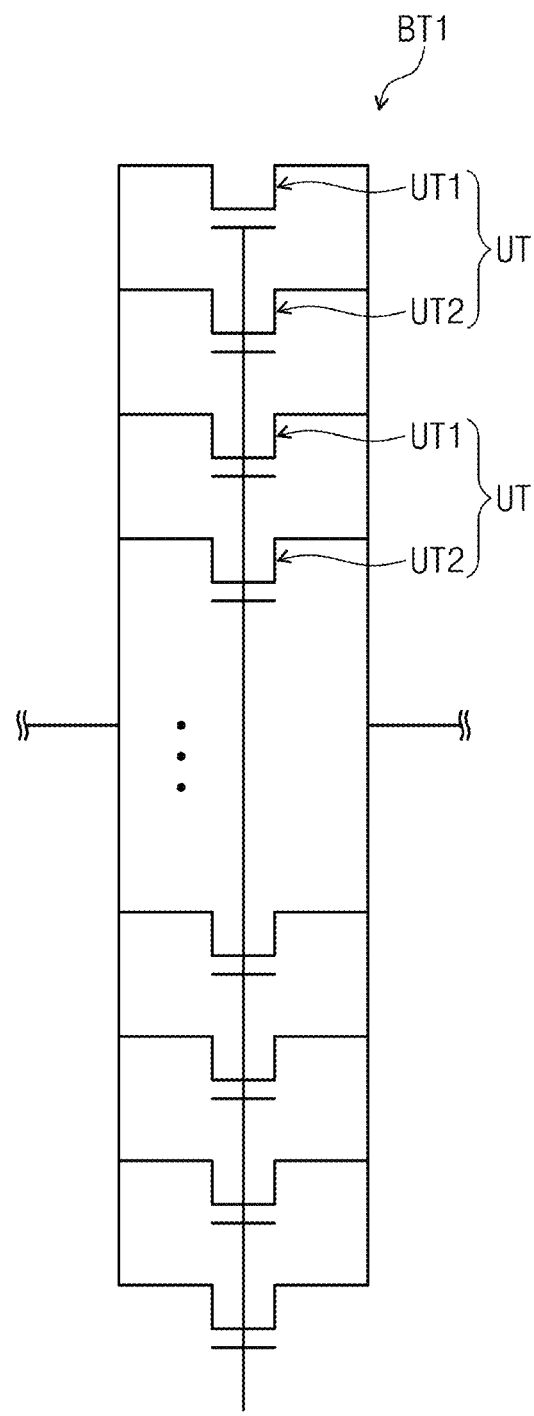
FIG. 7 is a schematic diagram of an equivalent circuit of a first buffer transistor.
Figure 8A:
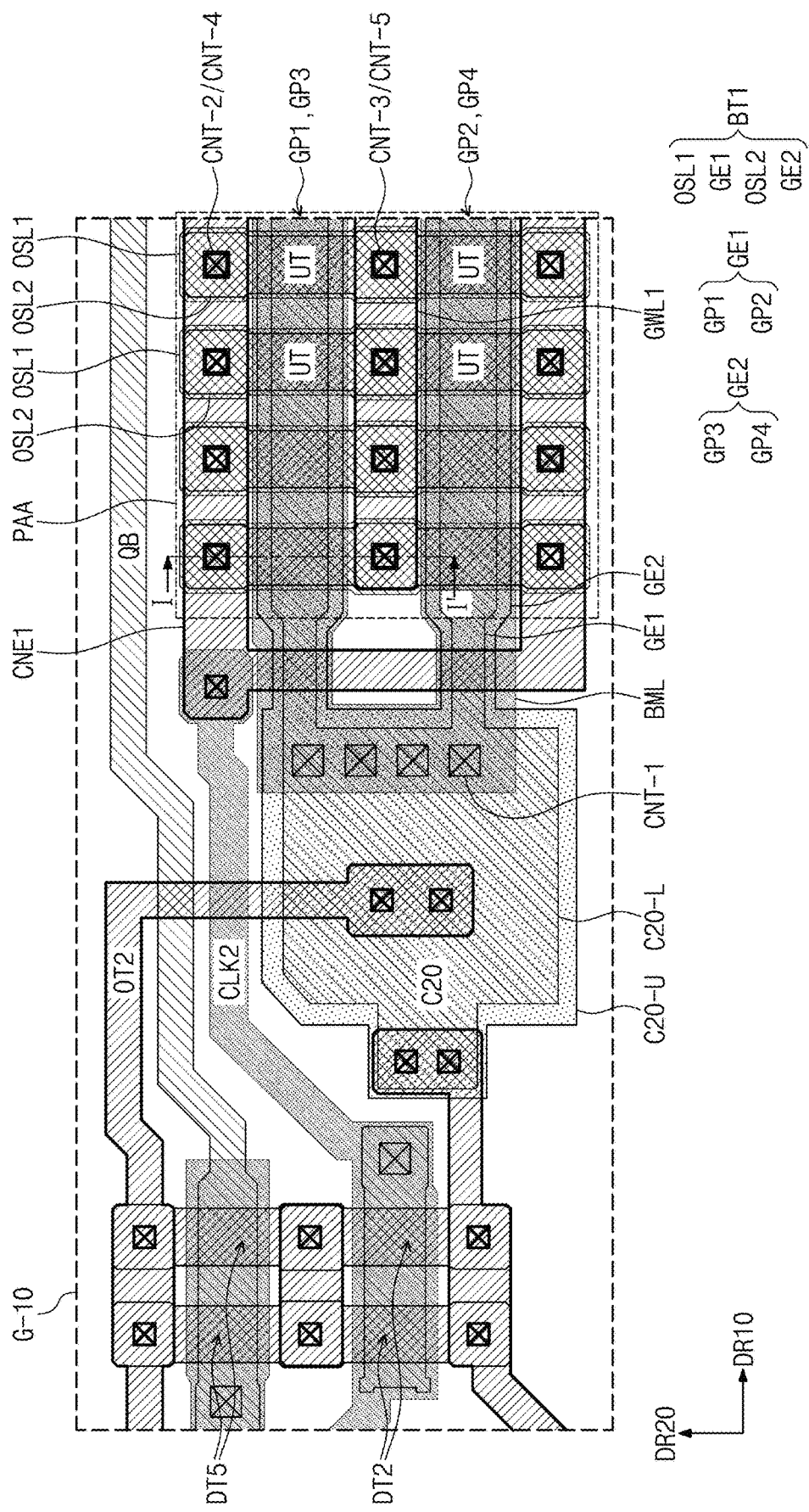
FIG. 8A is a schematic plane view illustrating an enlarged first region of FIG. 6.
Figure 8B:
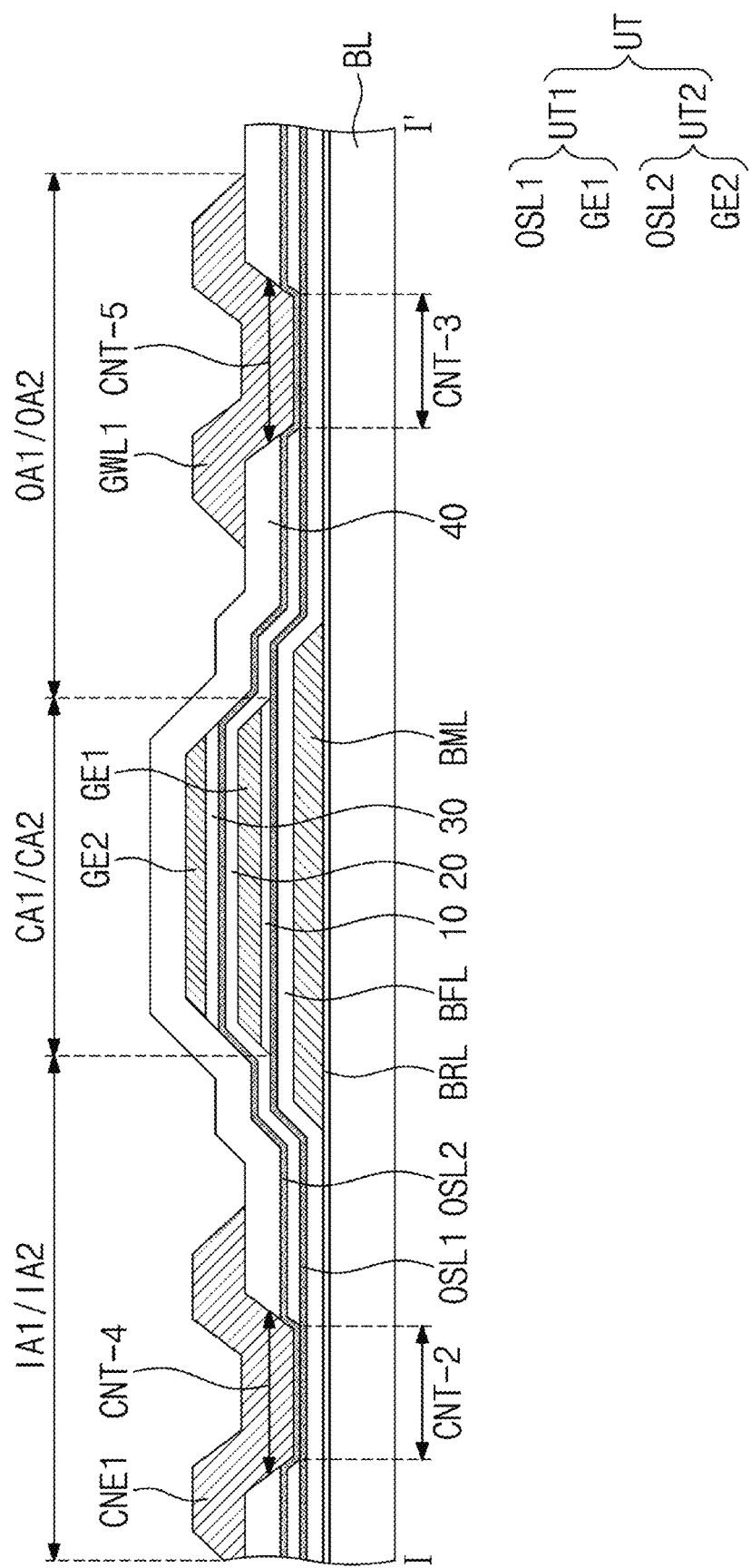
FIG. 8B is a schematic cross-sectional view corresponding to I-I' of FIG. 8A.
Figure 8D:
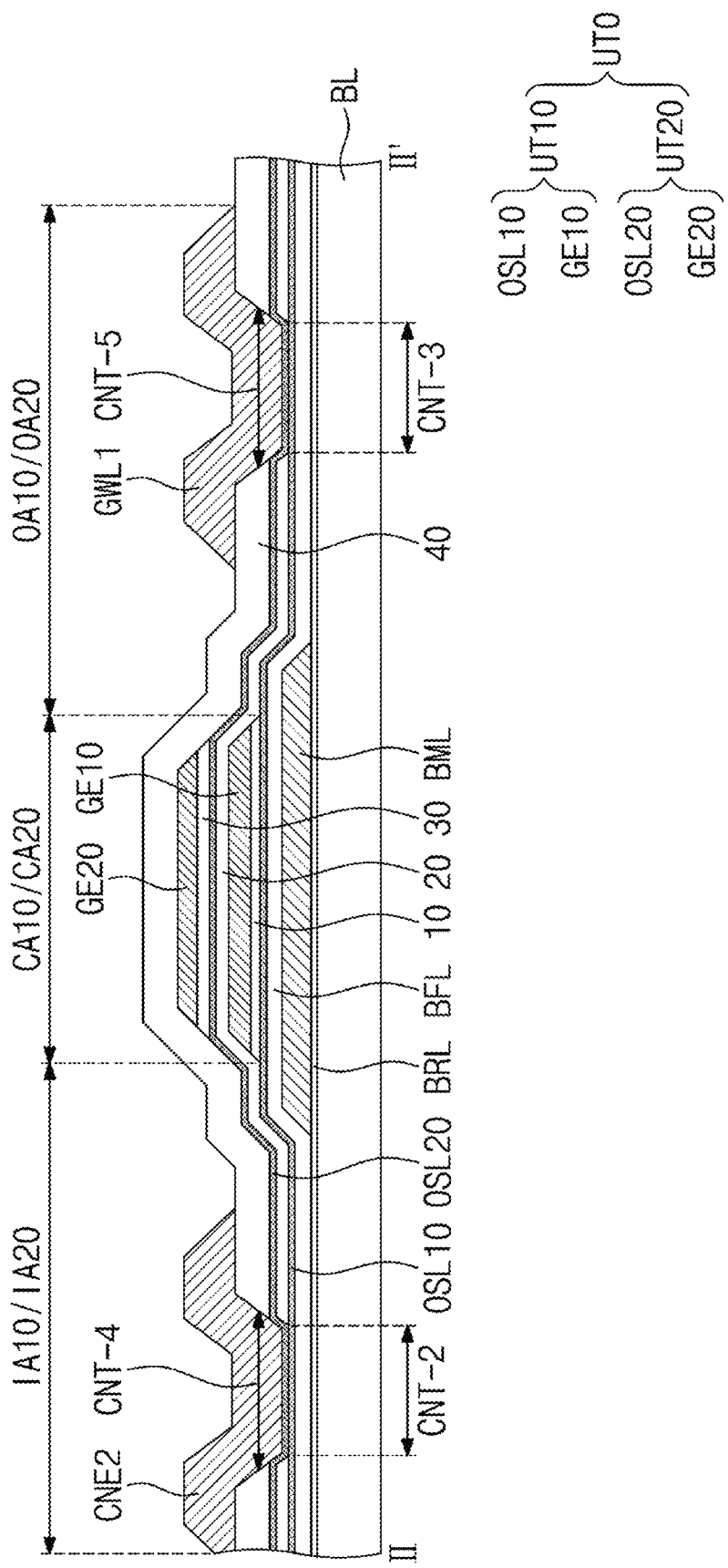
FIG. 8D is a schematic cross-sectional view corresponding to II-II' of FIG. 8C.
Figure 8E:
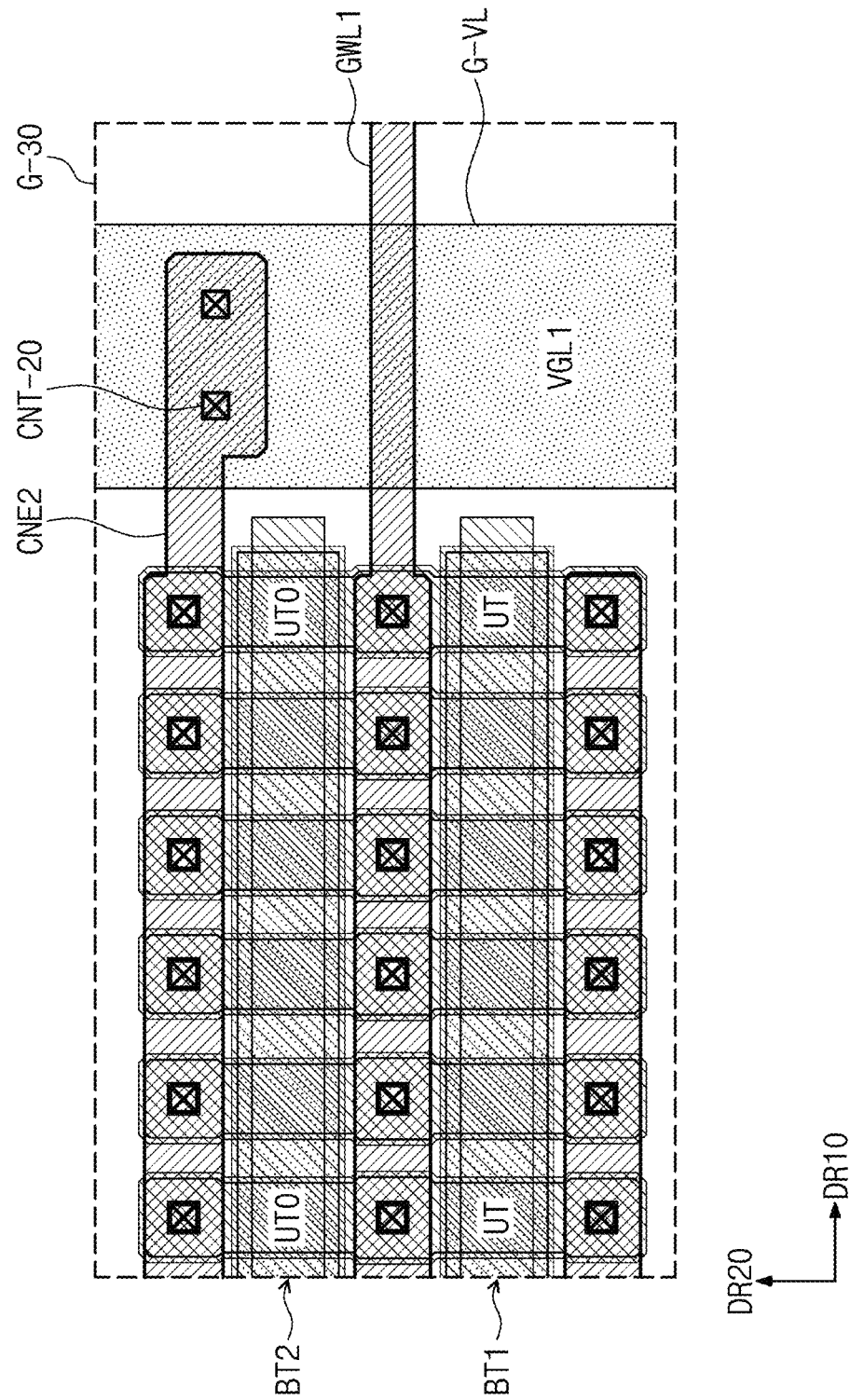
FIG. 8E is a schematic plan view illustrating an enlarged third region of FIG. 6.

FIG. 6 is a schematic plan view illustrating a layout of the first scan driving circuit GWD according to an embodiment. FIG. 7 is a schematic diagram of an equivalent circuit of the first buffer transistor BT1. FIG. 8A is a schematic plan view illustrating an enlarged first region G-10 of FIG. 6. FIG. 8B is a schematic cross-sectional view corresponding to I-I' of FIG. 8A. FIG. 8C is a schematic plan view illustrating an enlarged second region G-20 of FIG. 6. FIG. 8D is a cross-sectional view corresponding to II-II' of FIG. 8C. FIG. 8E is a schematic plan view illustrating an enlarged third region G-30 of FIG. 6.

FIG. 6 illustrates a layout of the first scan driving circuit GWD having the block diagram of FIG. 5B and the equivalent circuit of FIG. 5C. In a first region AR1, signal lines that provide the clock signals CLK1 and CLK2 to the first scan driving circuit GWD may be disposed. In a second region AR2, the first carry transistor CBT1, the second carry transistor CBT2, and the second capacitor C20 of the second output unit OPC2 and the first to sixth control transistors DT1 to DT6 of the control unit CRC described with reference to FIG. 5C may be disposed. In a third region AR3, the first buffer transistor BT1 and the second buffer transistor BT2 of the first output unit OPC1 described with reference to FIG. 5C may be disposed. In a 3-1 region AR3-1, the first buffer transistor BT1 may be disposed, and in a 3-2 region AR3-2, the second buffer transistor BT2 may be disposed.

Referring to FIG. 6, the occupancy area of the first output unit OPC1 in the area occupied by the first scan driving circuit GWD may be large as the first buffer transistor BT1 and the second buffer transistor BT2 include unit transistors UT. The unit transistors UT may increase the channel width of the first buffer transistor BT1 and of the second buffer transistor BT2 to generate the scan signal GWi (see FIG. 4B) having a sharp rising edge and a sharp polling edge. Since the increase in the unit transistors UT is the same as the increase in the channel width, the unit transistors UT may be formed in a wide region in order to ensure output properties of the first buffer transistor BT1 and the second buffer transistor BT2.

FIG. 7 illustrates the unit transistors UT connected in parallel and constituting the first buffer transistor BT1. The unit transistors UT may include first unit transistors UT1 and second unit transistors UT2, and a single first unit transistor UT1 and a single second unit transistor UT2 form a pair.

FIG. 8A to FIG. 8E illustrate enlarged different regions G-10, G-20, and G-30 of the first scan driving circuit GWD in order to describe the structure of the first buffer transistor BT1 and of the second buffer transistor BT2. In FIG. 8A, the second control transistor DT2, the fifth control transistor DT5, and the second capacitor C20 are illustrated with the first buffer transistor BT1. The connection relationship of the second control transistor DT2, the fifth control transistor DT5, the second capacitor C20, and the first buffer transistor BT1 is the same as the equivalent circuit of FIG. 5C.

FIG. 8A illustrates a layout corresponding to the second control transistor DT2, the fifth control transistor DT5, the second capacitor C20, and the first buffer transistor BT1 in the equivalent circuit of FIG. 5C. A gate of the second control transistor DT2 and a drain of the first buffer transistor BT1 may receive the second clock signal CLK2. The second capacitor C20 and the fifth control transistor DT5 may be connected (e.g., electrically connected) to the second output terminal OT2. The second capacitor C20 and the second control transistor DT2 may be connected (e.g., electrically connected) to the first node Q. A gate of the fifth control transistor DT5 may be connected (e.g., electrically connected) to the second node QB. The first buffer transistor BT1 may be connected (e.g., electrically connected) to the scan line GWL1. Hereinafter, referring to FIG. 8A to FIG. 8E, the structure of the first buffer transistor BT1 will be described in detail.

Referring to FIG. 8A, the first buffer transistor BT1 may include first semiconductor pattern layers OSL1, a first gate electrode GE1, second semiconductor pattern layers OSL2, and a second gate electrode GE2. In FIG. 8A, the first semiconductor pattern layers OSL1 are illustrated as overlapping the second semiconductor pattern layers OSL2 on a one-to-one basis. In order to distinguish the first semiconductor pattern layer OSL1 from the second semiconductor pattern layer OSL2, the first semiconductor pattern layer OSL1 is illustrated as being bigger than the second semiconductor pattern layer OSL2, but embodiments are not limited thereto, and the first semiconductor pattern layer OSL1 and the second semiconductor pattern layer OSL2 may have the same area. For example, the first gate electrode GE1 may overlap the second gate electrode GE2. In order to distinguish the first gate electrode GE1 from the second gate electrode GE2, the second gate electrode GE2 is illustrated as having a bigger area. On a lower side of the first gate electrode GE1, a shielding electrode BML may be disposed. The shielding electrode BML may overlap the first gate electrode GE1, and may have a shape corresponding to the first gate electrode GE1.

The first semiconductor pattern layers OSL1 and the second semiconductor pattern layers OSL2 may be extended in a second direction DR20, and may be arranged in a first direction DR10 intersecting the second direction DR20. The second direction DR20 may be parallel to the second direction DR2 of FIG. 1, but is not limited to being parallel thereto.

The first gate electrode GE1 and the second gate electrode GE2 may be electrically connected through first contactholes CNT-1. The first gate electrode GE1 may be extended in the first direction DR10, and may include a first portion GP1 and a second portion GP2 spaced apart in the second direction DR20. The second gate electrode GE2 may be extended in the first direction DR10, and may include a third portion GP3 and a fourth portion GP4 spaced apart in the second direction DR20. The first portion GP1 may overlap the third portion GP3, and the second portion GP2 may overlap the fourth portion GP4.

The first portion GP1 and the second portion GP2 of the first gate electrode GE1 may be connected through a lower electrode C20-L of the second capacitor C20. The third portion GP3 and the fourth portion GP4 of the second gate electrode GE2 may be connected through an upper electrode C20-U of the second capacitor C20. The first buffer transistor BT1 may receive the second clock signal CLK2 through a first connection electrode CNE1.

The first buffer transistor BT1 may include the unit transistors UT connected in parallel. Each of the unit transistors UT may include the first unit transistors UT1 and the second unit transistors UT2 described with reference to FIG. 7.

As illustrated in FIG. 8A, the unit transistors UT may form a first row and a second row. Unit transistors UT of the first row may be disposed to correspond to (or to overlap) the first portion GP1 of the first gate electrode GE1, and unit transistors UT of the second row may be disposed to correspond to (or to overlap) the second portion GP2 of the first gate electrode GE1. Since the scan line GWL1 is disposed between the unit transistors UT of the first row and the unit transistors UT of the second row, the unit transistors UT of the first row and the unit transistors UT of the second row have a symmetrical structure with respect to the first direction DR10. For example, the arrangement of a drain (or an input region) and a source (or an output region) of a unit transistor UT of the first row may be symmetrical to the arrangement of a drain (or an input region) and a source (or an output region) of a unit transistor UT of the second row with respect to the first direction DR10. Referring to FIG. 8A to FIG. 8E, unit transistors UT including a first row shorter than a second row are illustrated.

Hereinafter, referring to FIG. 8B, one unit transistor UT will be described in detail. A barrier layer BRL may be disposed on an upper surface of the base layer BL. The shielding electrode BML may be disposed on the barrier layer BRL. A buffer layer BFL which covers the shielding electrode BML may be disposed on the barrier layer BRL. The barrier layer BRL or the buffer layer BFL may include a silicon oxide layer and a silicon nitride layer. The silicon oxide layer and the silicon nitride layer may be alternately laminated.

A first semiconductor pattern layer OSL1 may be disposed on the buffer layer BFL. The first semiconductor pattern layer OSL1 may correspond to one of pattern layers of a semiconductor layer disposed on the buffer layer BFL. The first semiconductor pattern layer OSL1 may include a metal oxide. The metal oxide semiconductor may include a crystalline or amorphous oxide semiconductor. For example, the oxide semiconductor may include a metal oxide of such as zinc (Zn), indium (In), gallium (Ga), tin (Sn), and titanium (Ti), or a mixture of a metal such as zinc (Zn), indium (In), gallium (Ga), tin (Sn), and titanium (Ti) and an oxide thereof. The oxide semiconductor may include an indium-tin oxide (ITO), an indium-gallium-zinc oxide (IGZO), a zinc oxide (ZnO), an indium-zinc oxide (IZnO), a zinc-indium oxide (ZIO), an indium oxide (InO), a titanium oxide (TiO), an indium-zinc-tin oxide (IZTO), a zinc-tin oxide (ZTO), and the like.

The first semiconductor pattern layer OSL1 may include regions distinguished according to whether a metal oxide is reduced or not. A region, in which the metal oxide is reduced (hereinafter, a reduction region), may have greater conductivity than a region in which the metal oxide is not reduced (hereinafter, a non-reduction region). The reduction region substantially may function as a source/drain or signal line of a transistor. The non-reduction region may substantially correspond to a semiconductor region (or channel) of the transistor. For example, a portion of a semiconductor pattern layer may be a semiconductor region of a transistor, another portion thereof may be a source/drain of the transistor, and the other portion thereof may be a signal transmissive region.

The first semiconductor pattern layer OSL1 may include a first input region IA1 (or a drain region), a first channel region CA1 (or a semiconductor region), and a first output region OA1 (or a source region). The first channel region CA1 may be disposed between the first input region IA1 and the first output region OA1. The first input region IA1 of the first semiconductor pattern layer OSL1 may correspond to the drain of the first buffer transistor BT1, and the first output region OA1 thereof may correspond to a source of the first buffer transistor BT1.

On the first semiconductor pattern layer OSL1, a first insulation layer 10 may be disposed. The first insulation layer 10 may overlap the first channel region CA1. In an embodiment, the first insulation layer 10 may not be formed on the entire base layer BL, but may overlap only a specific conductive pattern layer to be described below. However, embodiments are not limited thereto, and in an embodiment, the first insulation layer 10 may overlap the entire base layer BL.

On the first insulation layer 10, the first gate electrode GE1 may be disposed. On the buffer layer BFL, the first semiconductor pattern layer OSL1, and a second insulation layer 20 which covers the first gate electrode GE1 may be disposed. On the second insulation layer 20, the second semiconductor pattern layer OSL2 may be disposed. The second semiconductor pattern layer OSL2 may correspond to one of pattern layers of a semiconductor layer disposed on the second insulation layer 20. The second semiconductor pattern layer OSL2 may include a metal oxide. The second semiconductor pattern layer OSL2 may include any one of the above-described metal oxide semiconductor materials of the first semiconductor pattern layer OSL1. The first semiconductor pattern layer OSL1 and the second semiconductor pattern layer OSL2 may include the same metal oxide or may include different metal oxides.

The second semiconductor pattern layer OSL2 may include a second input region IA2 (or a drain region), a second channel region CA2 (or a semiconductor region), and a second output region OA2 (or a source region). The second input region IA2 of the second semiconductor pattern layer OSL2 may be connected (e.g., electrically connected) to the first input region IA1 of the first semiconductor pattern layer OSL1 through a second contact-hole CNT-2 passing through the second insulation layer 20. The second output region OA2 of the second semiconductor pattern layer OSL2 may be connected (e.g., electrically connected) to the first output region OA1 of the first semiconductor pattern layer OSL1 through a third contact-hole CNT-3 passing through the second insulation layer 20.

On the second semiconductor pattern layer OSL2, a third insulation layer 30 may be disposed. The third insulation layer 30 may overlap the second channel region CA2 of the second semiconductor pattern layer OSL2. In an embodiment, the third insulation layer 30 may not be formed on the entire base layer BL, but may overlap only a specific conductive pattern layer to be described below. The third insulation layer 30 may overlap the entire base layer BL. The third insulation layer 30 is illustrated as being slightly smaller than the first insulation layer 10, but is not limited thereto. On a cross-section of FIG. 8B, the third insulation layer 30 may have the same length as the first insulation layer 10.

On the third insulation layer 30, the second gate electrode GE2 may be disposed. On the second insulation layer 20, a fourth insulation layer 40 which covers the second semiconductor pattern layer OSL2 and the second gate electrode GE2 may be disposed. On the fourth insulation layer 40, the first connection electrode CNE1 and the scan line GWL1 may be disposed. The first connection electrode CNE1 and the scan line GWL1 may correspond to (or may be formed of) different conductive pattern layers from each other which are formed from a conductive layer disposed on the fourth insulation layer 40. The first connection electrode CNE1 may be connected (e.g., electrically connected) to the second input region IA2 of the second semiconductor pattern layer OSL2 through a fourth contact-hole CNT-4 passing through the fourth insulation layer 40. The scan line GWL1 may be connected (e.g., electrically connected) to the second output region OA2 of the second semiconductor pattern layer OSL2 through a fifth contact-hole CNT-5 passing through the fourth insulation layer 40. For example, on the fourth insulation layer 40, an insulation layer which covers the first connection electrode CNE1 and the scan line GWL1 may be further disposed.

Referring to FIG. 8B, the first semiconductor pattern layer OSL1 and the first gate electrode GE1 may define (or form) the first unit transistor UT1 of FIG. 7, and the second semiconductor pattern layer OSL2 and the second gate electrode GE2 may define (or form) the second unit transistor UT2 of FIG. 7. The first input region IA1 of the first unit transistor UT1, the second input region IA2 of the second unit transistor UT2, and the first connection electrode CNE1 may be connected (e.g., electrically connected) to each other, and the first output region OA1 of the first unit transistor UT1, the second output region OA2 of the second unit transistor UT2, and the scan line GWL1 may be connected (e.g., electrically connected) to each other.

Referring to FIG. 8C, the unit transistors UT of the first row of the first buffer transistor BT1 may be cut off in a region adjacent to the first capacitor C10. The unit transistors UT of the second row of the first buffer transistor BT1 may be extended past the region adjacent to the first capacitor C10. The first portion GP1 of the first gate electrode GE1 of the first buffer transistor BT1 may be cut off adjacent to the first capacitor C10. The first connection electrode CNE1 illustrated in FIG. 8A may be also cut off adjacent to the first capacitor C10 to correspond to the first portion GP1 of the first gate electrode GE1. The first portion GP1 of the first gate electrode GE1 of the first buffer transistor BT1 may be longer than the second portion GP2.

In the region adjacent to the first capacitor C10, unit transistors UT0 of a first row of the second buffer transistor BT2 may be disposed. The unit transistors UT0 of the first row of the second buffer transistor BT2 and the unit transistors UT of the first row of the first buffer transistor BT1 may be disposed in the same row. The first capacitor C10 may be disposed between the unit transistors UT0 of the first row of the second buffer transistor BT2 and the unit transistors UT of the first row of the first buffer transistor BT1. A first gate electrode GE10 (or a third gate electrode) may be connected (e.g., electrically connected) to a lower electrode C10-L of the first capacitor C10, and a second gate electrode GE20 (or a fourth gate electrode) may be connected (e.g., electrically connected) to an upper electrode C10-U of the first capacitor C10. The second buffer transistor BT2 may be connected (e.g., electrically connected) to the first capacitor C10 through a second connection electrode CNE2.

The second buffer transistor BT2 may include the first gate electrode GE10 corresponding to the first portion GP1 of the first buffer transistor BT1, and may include the second gate electrode GE20 corresponding to the second portion GP2 of the first buffer transistor BT1. The first gate electrode GE10 and the second gate electrode GE20 may be electrically connected through a tenth contact-hole CNT-10.

For example, the unit transistors UT0 of the first row of the second buffer transistor BT2 and the unit transistors UT of the first row of the first buffer transistor BT1 may have substantially the same structure. Referring to FIG. 8D, the unit transistors UT0 of the first row of the second buffer transistor BT2 and the unit transistors UT of the first row of the first buffer transistor BT1 illustrated in FIG. 8C may have the same laminate structure.

One half of a first semiconductor pattern layer OSL10 may define (or form) the unit transistor UT0 of the second buffer transistor BT2, and the other half of the first semiconductor pattern layer OSL10 may define (or form) the unit transistor UT of the first buffer transistor BT1. One half of a second semiconductor pattern layer OSL20 may define (or form) the unit transistor UT0 of the second buffer transistor BT2, and the other half of the second semiconductor pattern layer OSL20 may define (or form) the unit transistor UT of the first buffer transistor BT1.

Referring to FIG. 8D, the unit transistors UT0 of the first row of the second buffer transistor BT2 include first unit transistors UT10 and second unit transistors UT20. The first semiconductor pattern layer OSL10 (or a third semiconductor pattern layer) of FIG. 8D may correspond to the first semiconductor pattern layer OSL1 of FIG. 8B, the first gate electrode GE10 of FIG. 8D may correspond to the first gate electrode GE1 of FIG. 8B, the second semiconductor pattern layer OSL20 (or a fourth semiconductor pattern layer) of FIG. 8D corresponds to the second semiconductor pattern layer OSL2 of FIG. 8B, and the second gate electrode GE20 of FIG. 8D may correspond to the second gate electrode GE2 of FIG. 8B. Components corresponding to FIG. 8B and FIG. 8D are formed by the same process and include the same materials.

A second input region IA20 (or a fourth input region) of the second semiconductor pattern layer OSL20 may be connected (e.g., electrically connected) to a first input region IA10 of the first semiconductor pattern layer OSL10 through the second contact-hole CNT-2 passing through the second insulation layer 20. A second output region OA20 (or a fourth output region) of the second semiconductor pattern layer OSL20 may be connected (e.g., electrically connected) to a first output region OA10 (or a third output region) of the first semiconductor pattern layer OSL10 through the third contact-hole CNT-3 passing through the second insulation layer 20. A second channel region CA20 (or a fourth channel region) of the second semiconductor pattern layer OSL20 may overlap a first channel region CA10 (or a third channel region) of the first semiconductor pattern layer OSL10. For example, the first semiconductor pattern layer OSL10 of FIG. 8D is substantially the same as the first semiconductor pattern layer OSL1 of FIG. 8B, and the second semiconductor pattern layer OSL20 of FIG. 8D is substantially the same as the second semiconductor pattern layer OSL2 of FIG. 8B.

Referring to FIG. 8E, a voltage line G-VL may receive the first low-voltage VGL1. The second connection electrode CNE2 may be connected (e.g., electrically connected) to the voltage line G-VL through a twentieth contact-hole CNT-20. In a cross-sectional view of a display panel, the voltage line G-VL may be disposed above the second connection electrode CNE2, and the twentieth contact-hole CNT-20 may pass through an insulation layer disposed between the voltage line G-VL and the second connection electrode CNE2. For example, the voltage line G-VL may be disposed above the fourth insulation layer 40 illustrated in FIG. 8B. The voltage line G-VL may be a conductive pattern layer disposed on the fifth insulation layer 50 or the sixth insulation layer 60 illustrated in FIG. 10 to be described below.

FIG. 9A to FIG. 9H are schematic plan views illustrating a process of manufacturing a scan driving circuit based on a partial region PAA of FIG. 8A. In each step of FIG. 9A to FIG. 9H, a photolithography process may be performed. A detailed description of a process of forming the barrier layer BRL, the buffer layer BFL, and the insulation layers 10, 20, 30, and 40 of FIG. 8B will be omitted for descriptive convenience. Hereinafter, for detailed descriptions of the same components as those described with reference to FIG. 8A and FIG. 8B will be omitted for descriptive convenience.

Figure 9A:
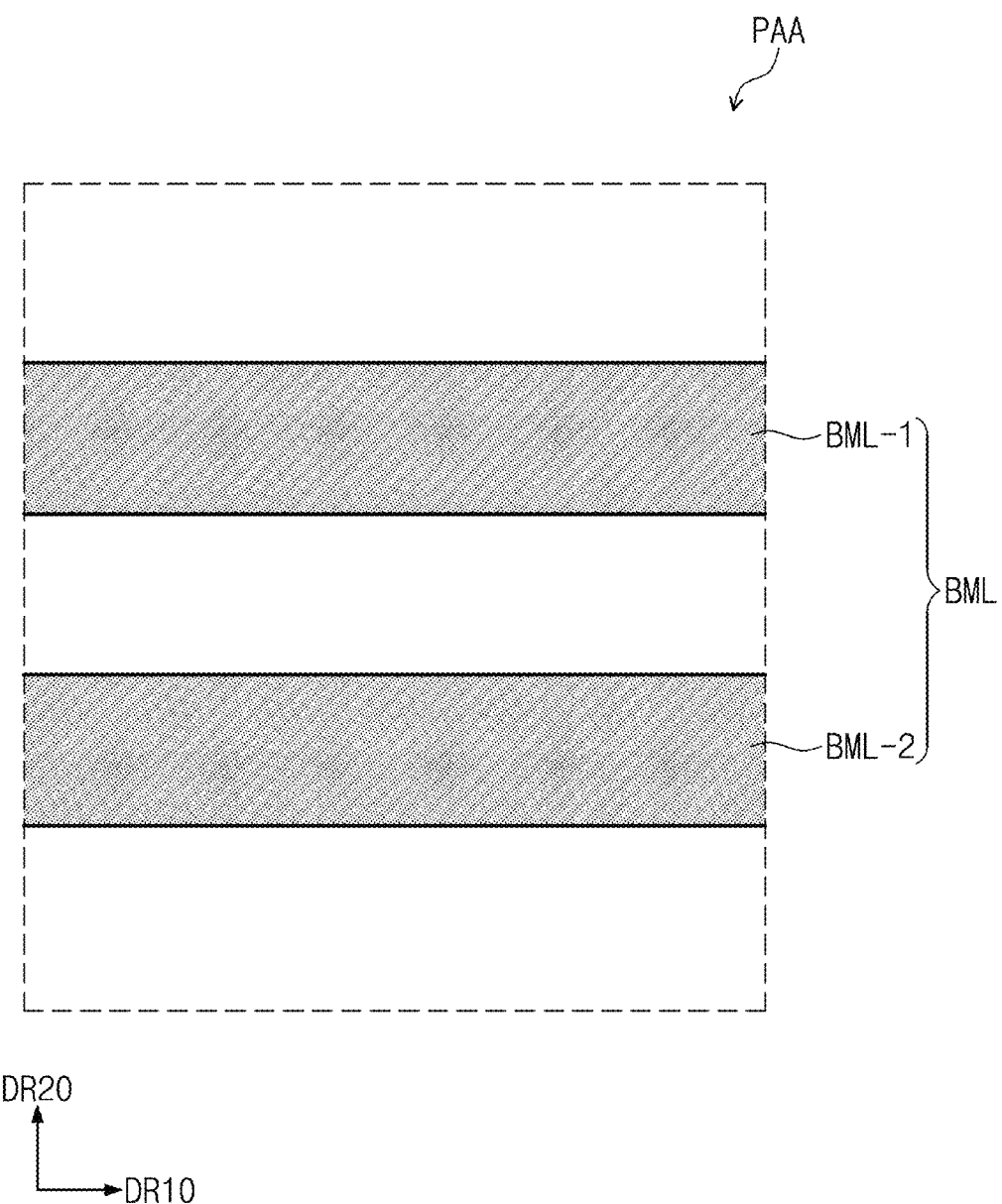
FIG. 9A to FIG. 9H are plan views illustrating a process of manufacturing a scan driving circuit based on a partial region of FIG. 8A.

Referring to FIG. 9A, the shielding electrode BML may be formed. The shielding electrode BML may include a first portion BML-1 and a second portion BML-2 which are spaced apart in the second direction DR20, and each of which is extended in the first direction DR10.

Figure 9B:
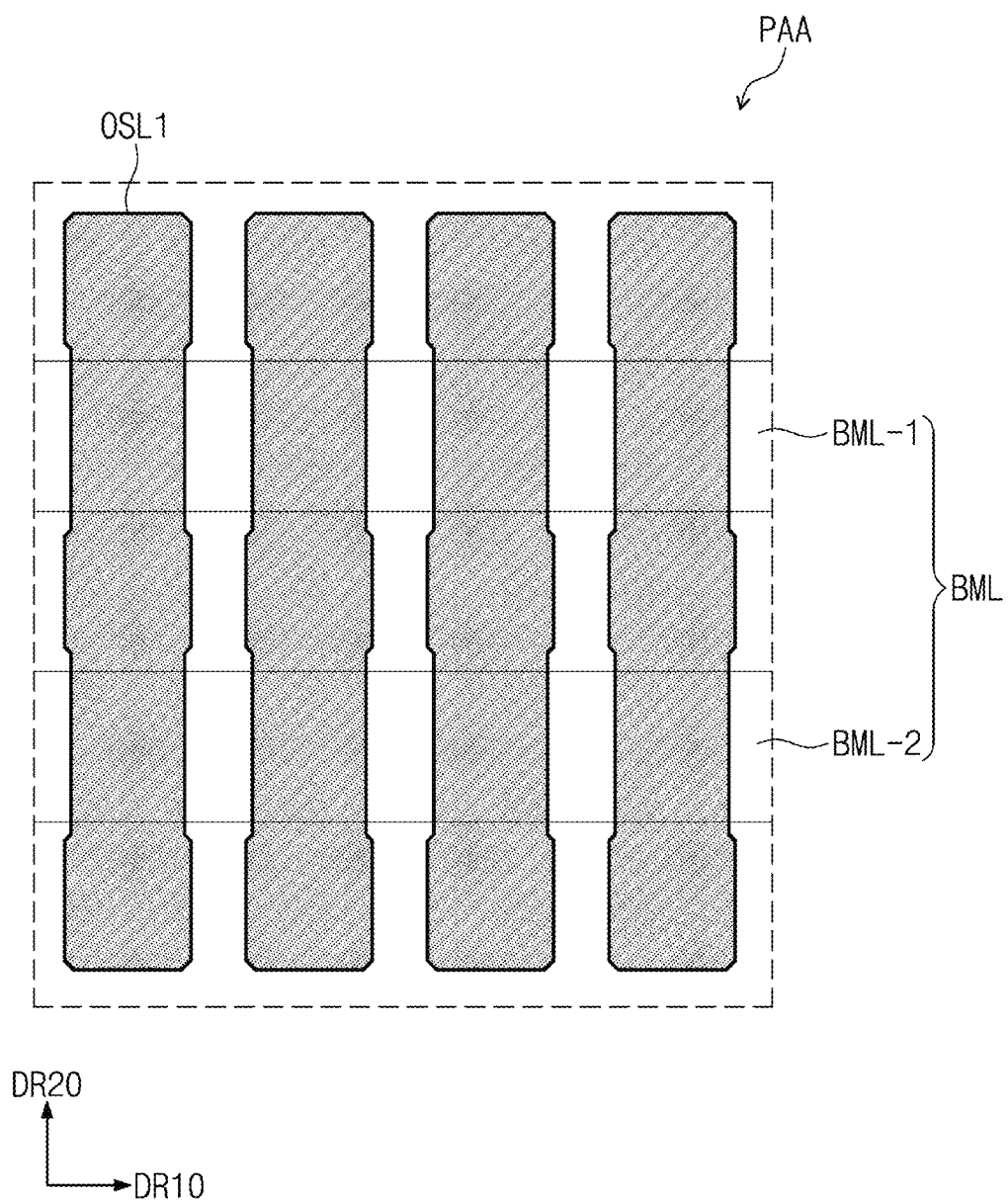

Referring to FIG. 9B, first semiconductor pattern layers OSL1 may be formed on the shielding electrode BML. The first semiconductor pattern layers OSL1 may be extended in the second direction DR20, and each of the first semiconductor pattern layers OSL1 may overlap the first portion BML-1 and the second portion BML-2.

Figure 9C:
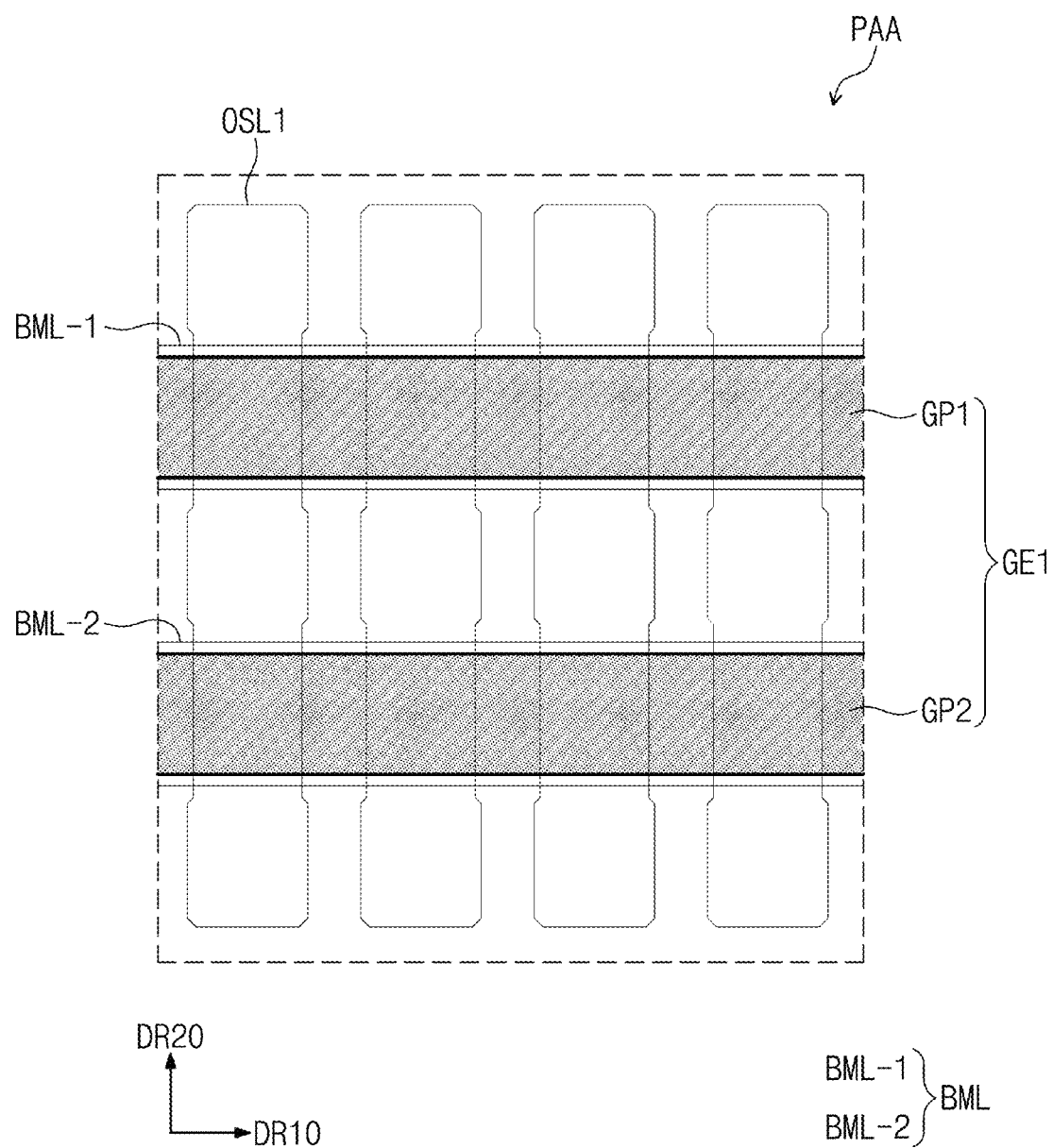

Referring to FIG. 9C, on the first semiconductor pattern layers OSL1, the first gate electrode GE1 may be formed. The first portion GP1 and the second portion GP2 of the first gate electrode GE1 may be formed to respectively overlap the first portion BML-1 and the second portion BML-2 of the shielding electrode BML.

Figure 9D:
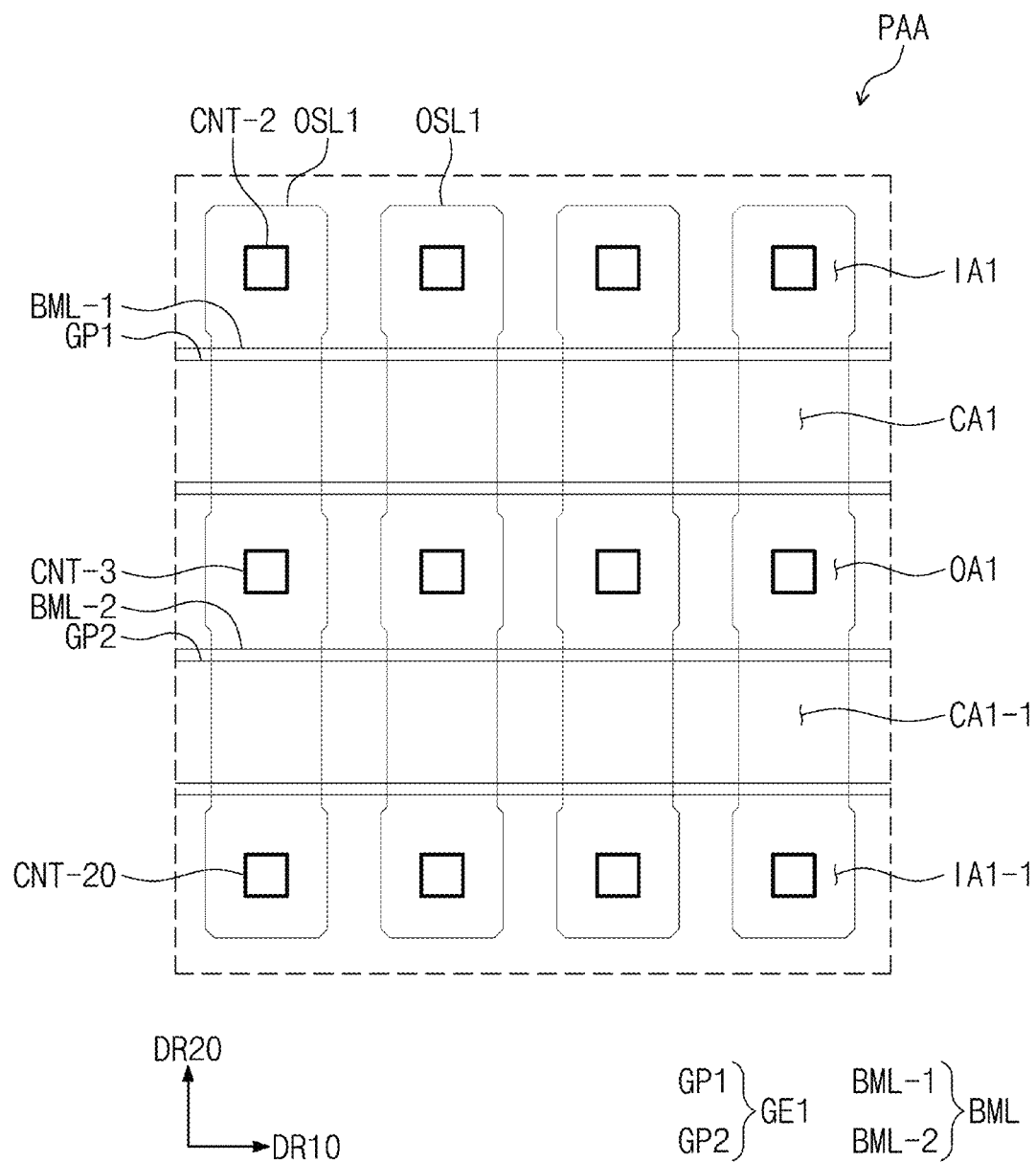

Referring to FIG. 9D, second contact-holes CNT-2 passing through the second insulation layer 20 (see FIG. 8B), 2-1 contact-holes CNT-20, and third contact-holes CNT-3 may be formed. As the second insulation layer 20 is formed, hydrogen of the second insulation layer 20 may be diffused from the first gate electrode GE1 of the first semiconductor pattern layers OSL1 to an exposed region to cause a reduction reaction of the first semiconductor pattern layers OSL1. Accordingly, the first semiconductor pattern layers OSL1 may be divided into regions having different conductivity. FIG. 9D illustrates divided regions of the first semiconductor pattern layers OSL1.

Each of the first semiconductor pattern layers OSL1 may include the first input region IA1, the first output region OA1, the first channel region CA1 disposed between the first input region IA1 and the first output region OA1, a 1-1 input region IA1-1, and a 1-1 channel region CA1-1 disposed between the 1-1 input region IA1-1 and the first output region OA1. In case that the first gate electrode GE1 includes only the first portion GP1 in an embodiment, the 1-1 input region IA1-1 and the 1-1 channel region CA1-1 may be omitted.

Figure 9E:
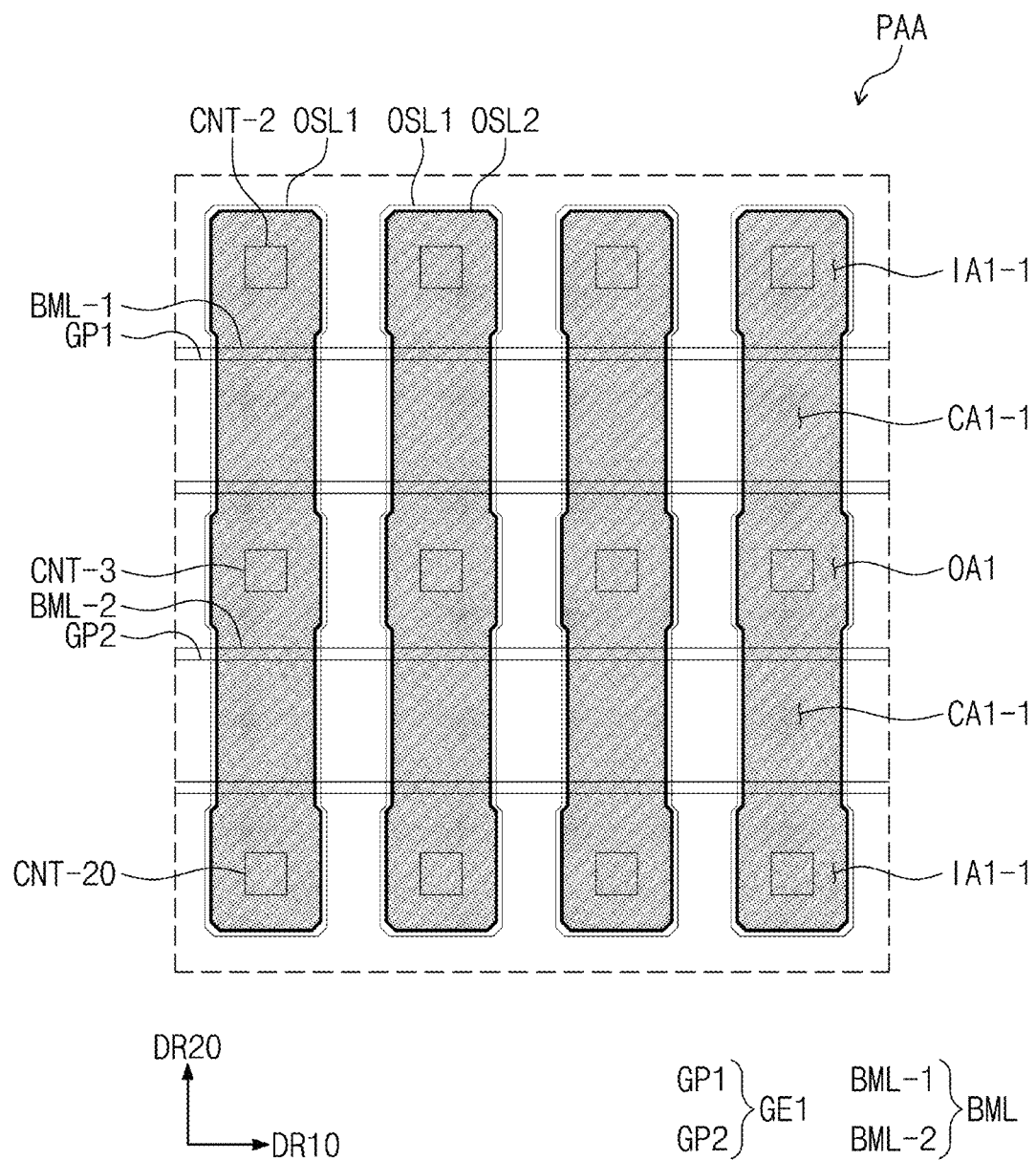

Referring to FIG. 9E, the second semiconductor pattern layers OSL2 may be formed on the second insulation layer 20 to overlap the first semiconductor pattern layer OSL1. Each of the second semiconductor pattern layers OSL2 may be connected (e.g., electrically connected) to corresponding first semiconductor pattern layers OSL1 through the second contact-holes CNT-2, the 2-1 contact-holes CNT-20, and the third contact-holes CNT-3.

Figure 9F:
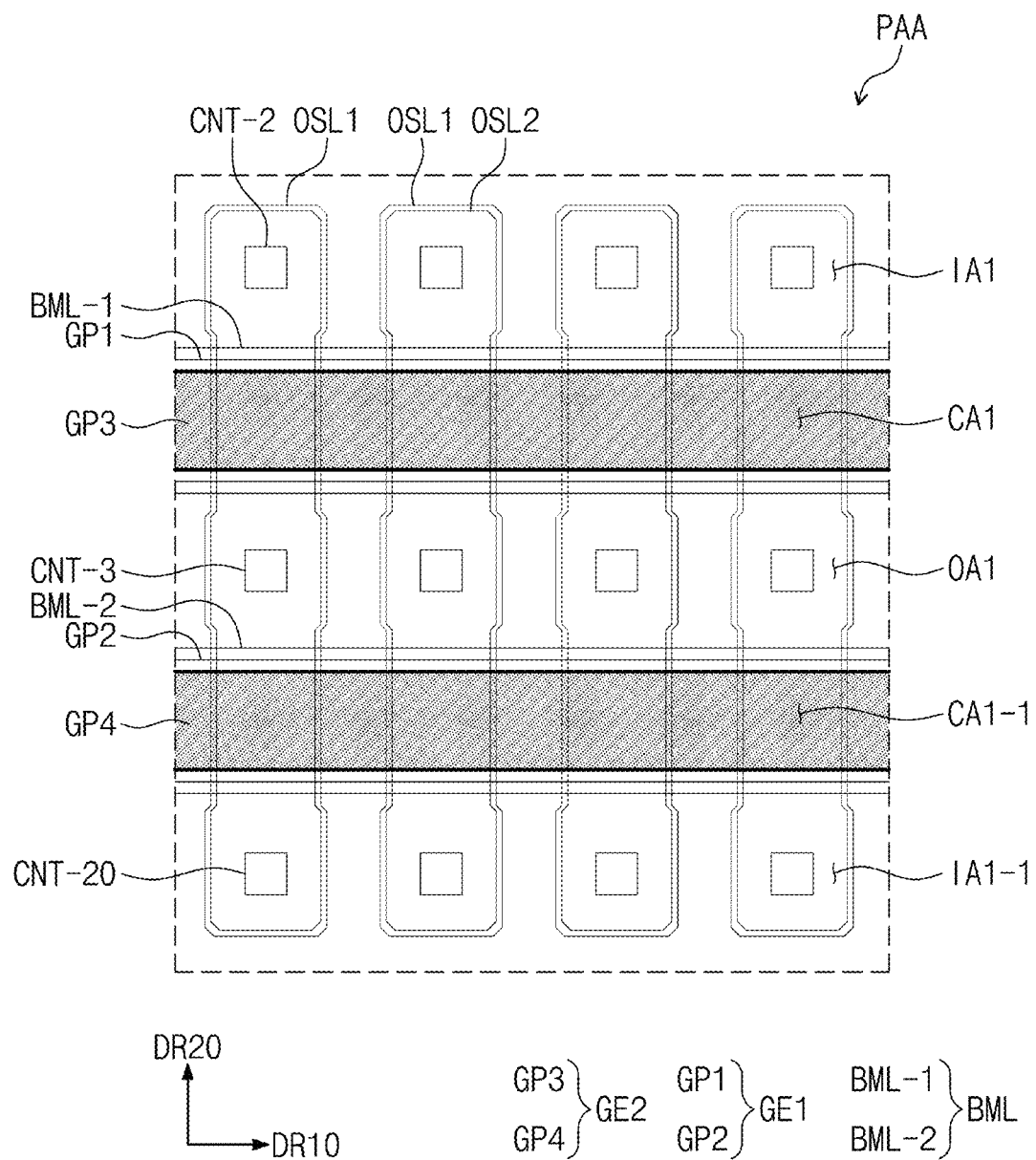

Referring to FIG. 9F, on the second semiconductor pattern layers OSL2, the second gate electrode GE2 may be formed. The third portion GP3 and the fourth portion GP4 of the second gate electrode GE2 may be formed to respectively overlap the first portion GP1 and the second portion GP2 of the first gate electrode GE1.

Figure 9G:
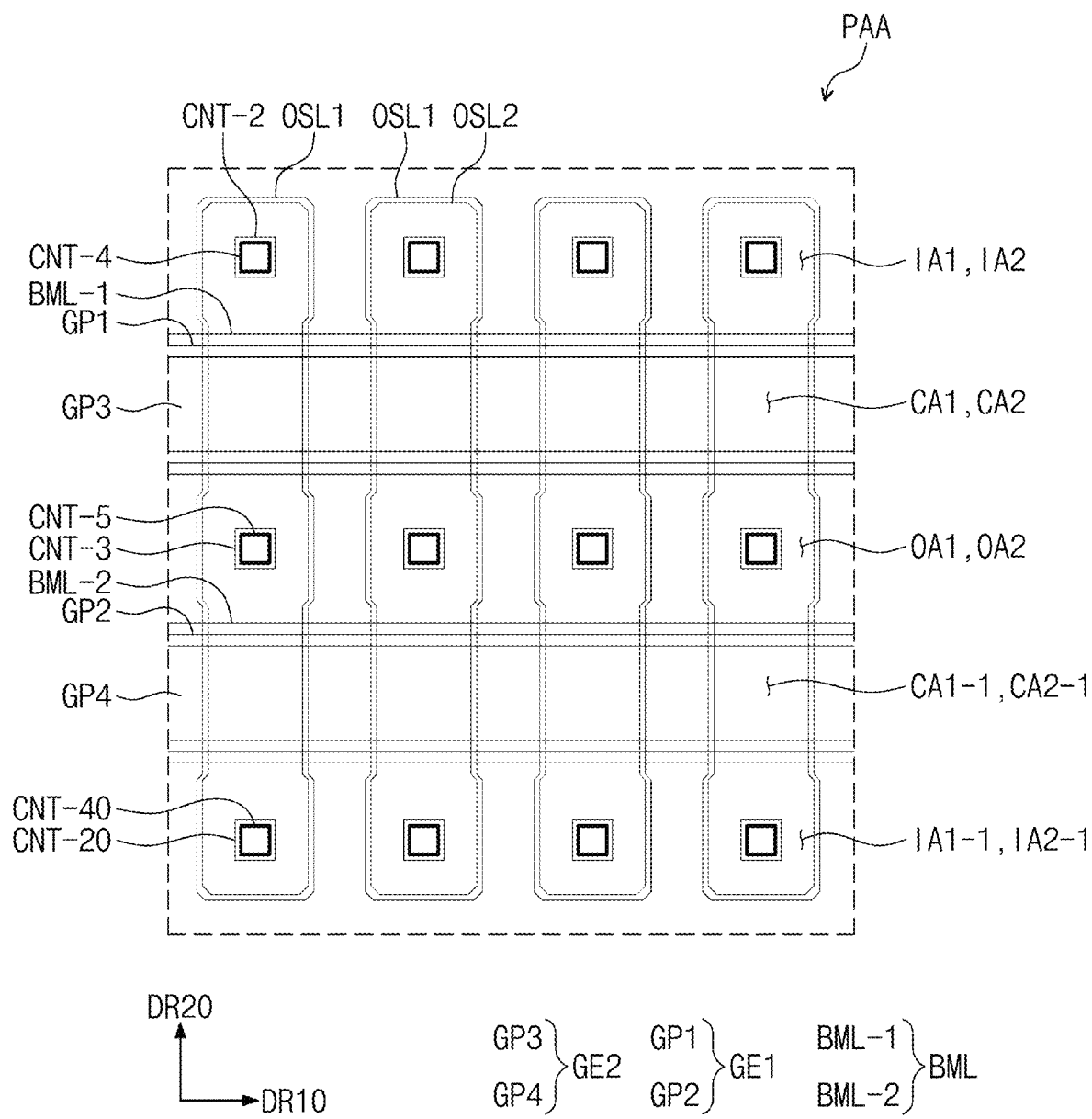

Referring to FIG. 9G, fourth contact-holes CNT-4 passing through the fourth insulation layer 40 (see FIG. 8B), 4-1 contact-holes CNT-40, and fifth contact-holes CNT-5 may be formed. During a process of forming the fourth insulation layer 40, the second semiconductor pattern layers OSL2 may be divided into regions having different conductivity. FIG. 9G illustrates divided regions of the second semiconductor pattern layers OSL2.

Each of the second semiconductor pattern layers OSL2 may include the second input region IA2, the second output region OA2, the second channel region CA2 disposed between the second input region IA2 and the second output region OA2, a 2-2 input region IA2-1, and a 2-1 channel region CA2-1 disposed between the 2-1 input region IA2-1 and the second output region OA2. In case that the second gate electrode GE2 includes only the third portion GP3 in an embodiment, the 2-1 input region IA2-1 and the 2-1 channel region CA2-1 may be omitted.

Figure 9H:
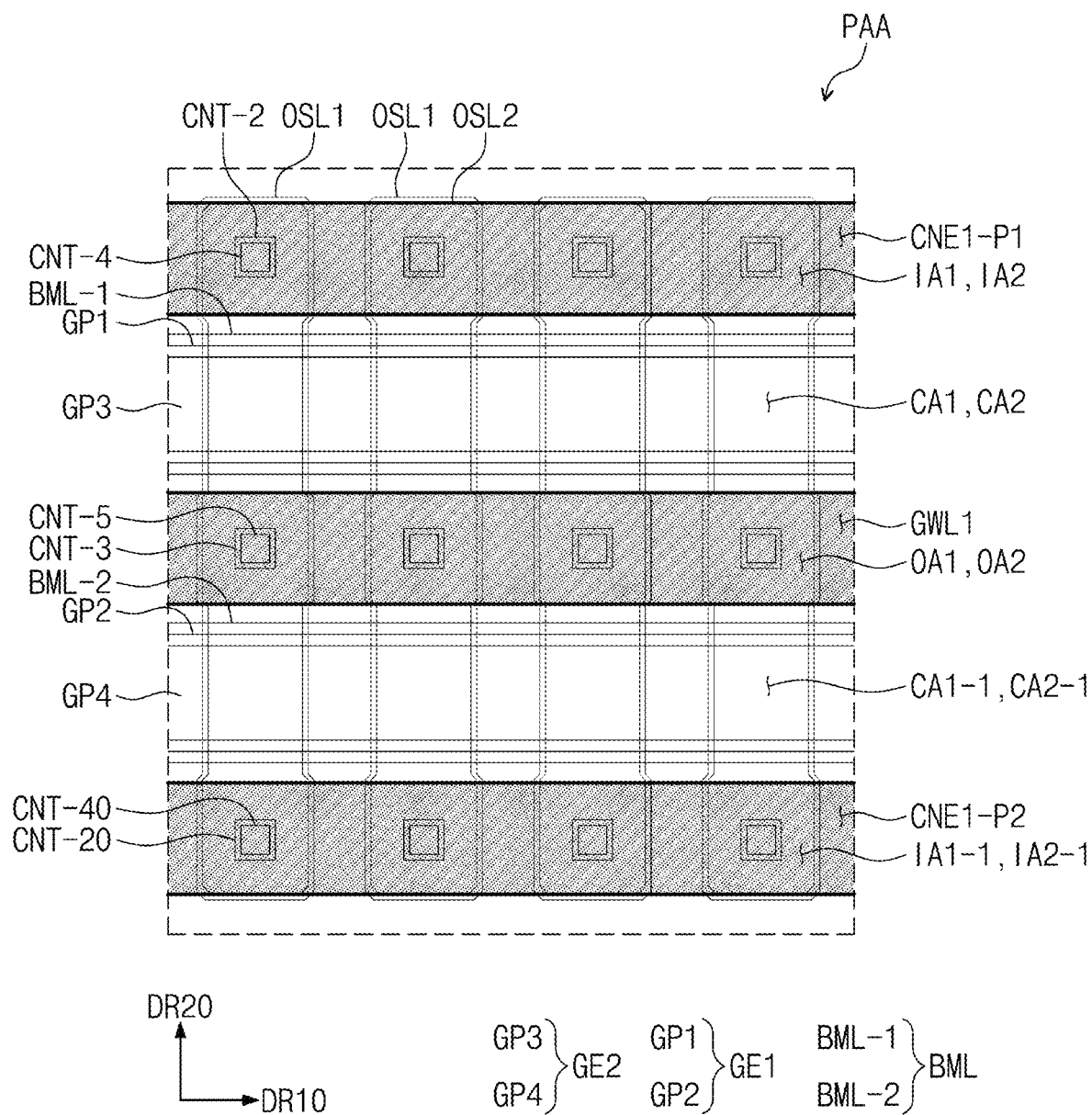

Referring to FIG. 9H, the first connection electrode CNE1 and the scan line GWL1 may be formed on the fourth insulation layer 40. The first connection electrode CNE1 may be connected (e.g., electrically connected) to the second input region IA2 and the 2-1 input region IA2-1 of each of the second semiconductor pattern layers OSL2 through the fourth contact-holes CNT-4 and the 4-1 contact-holes CNT-40. The scan line GWL1 may be connected (e.g., electrically connected) to the second output region OA2 of each of the second semiconductor pattern layers OSL2 through the fifth contact-holes CNT-5.

The first connection electrode CNE1 may include a portion CNE1-P1 corresponding to the second input region IA2 and a portion CNE1-P2 corresponding to the 2-1 input region IA2-1. The portion CNE1-P1 corresponding to the second input region IA2 may be defined (or formed) as a first conductive pattern layer, and the portion CNE1-P2 corresponding to the 2-1 input region IA2-1 may be defined (or formed) as a second conductive pattern layer. Referring to FIG. 8A, the first conductive pattern layer and the second conductive pattern layer may have a shape of a single body.

Figure 10:
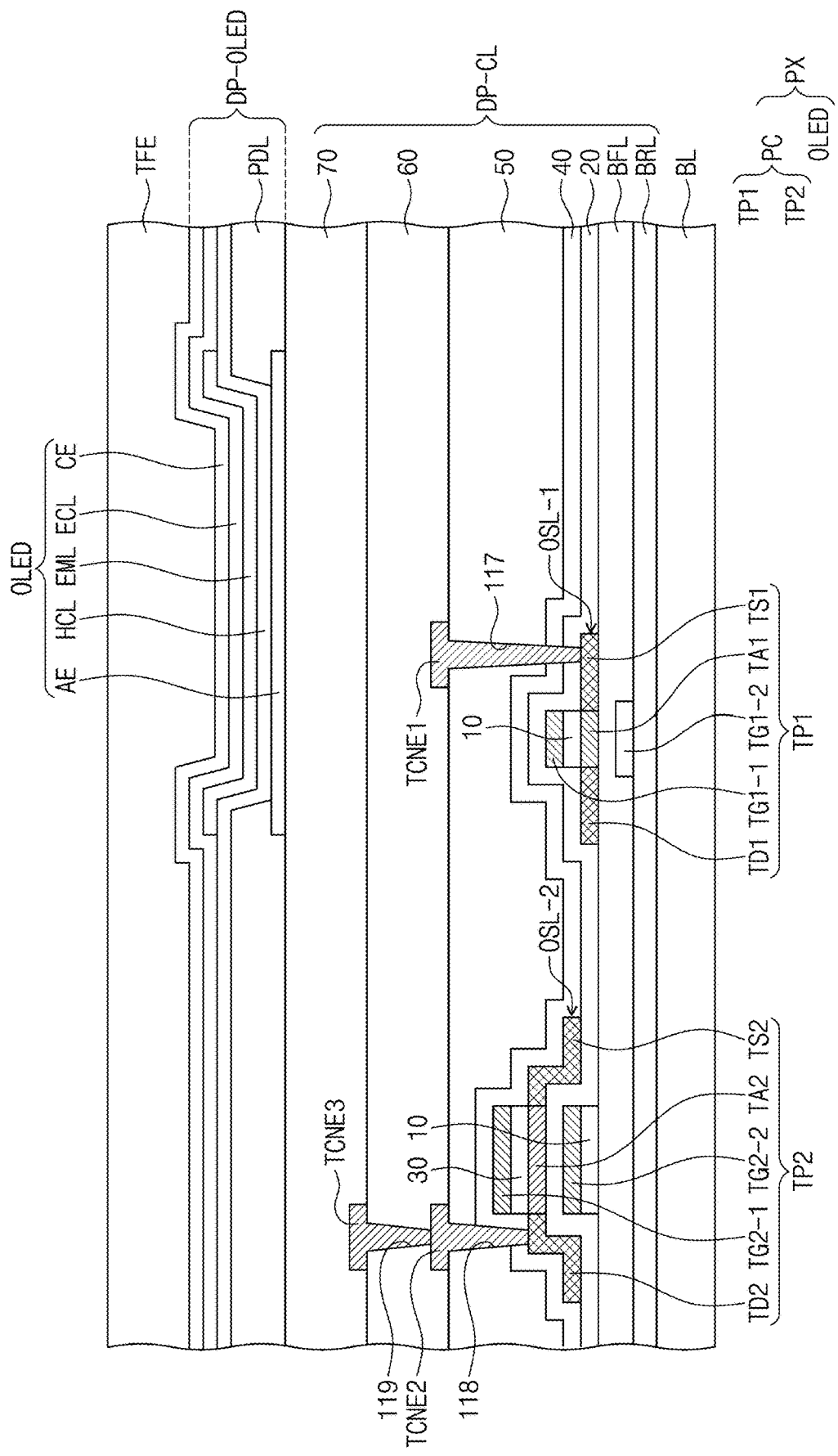
FIG. 10 is a schematic cross-sectional view of a pixel according to an embodiment.

FIG. 10 is a schematic cross-sectional view of a pixel according to an embodiment. FIG. 10 illustrates the same barrier layer BRL, the same buffer layer BFL, and the same insulation layers 10, 20, 30, and 40 illustrated in FIG. 8B, and for detailed descriptions thereof, refer to FIG. 8B.

Referring to FIG. 10, the pixel PX may include a pixel circuit PC and the light emitting element OLED. FIG. 10 illustrates a first-type transistor TP1 and a second-type transistor TP2 as the pixel circuit PC. The first to fifth transistors T1 to T5 illustrated in FIG. 4A may have the same laminate structure as any one transistor between the first-type transistor TP1 and the second-type transistor TP2. At least one of the first to fifth transistors T1 to T5 may have the same laminate structure as the first-type transistor TP1, and at least one thereof may have the same laminate structure as the second-type transistor TP2.

The first-type transistor TP1 may include a first lower gate electrode TG1-2 disposed on the same layer as a layer on which the shielding electrode BML of FIG. 8B is disposed, and may include a semiconductor pattern layer OSL-1 disposed on the same layer as a layer on which the first semiconductor pattern layer OSL1 of FIG. 8B may be disposed. The semiconductor pattern layer OSL-1 may include an output region TS1 (or a source region), a channel region TA1, and an input region TD1 (or a drain region). The first-type transistor TP1 may include a first upper gate electrode TG1-1 disposed on the same layer as a layer on which the first gate electrode GE1 of FIG. is disposed. 8B.

The second-type transistor TP2 may include a second lower gate TG2-2 disposed on the same layer as the layer on which the first gate electrode GE1 of FIG. 8B is disposed, and may include a semiconductor pattern layer OSL-2 disposed on the same layer as a layer on which the second semiconductor pattern layer OSL2 of FIG. 8B is disposed. The semiconductor pattern layer OSL-2 may include an output region TS2 (or a source region), a channel region TA2, and an input region TD2 (or a drain region). The second-type transistor TP2 may include a second upper gate electrode TG2-1 disposed on the same layer as the layer on which the second gate electrode GE2 of FIG. 8B is disposed.

On the fourth insulation layer 40, the fifth insulation layer 50, the sixth insulation layer 60, and a seventh insulation layer 70 may be disposed. Connection electrodes TCNE1 and TCNE2 disposed on the fifth insulation layer 50 are illustrated. The connection electrode TCNE1 may be connected (e.g., electrically connected) to the output region TS1 of the first semiconductor pattern layer OSL1 through a contact-hole 117 passing through the fifth insulation layer 50, and the connection electrode TCNE2 may be connected (e.g., electrically connected) to the input region TD2 of the second semiconductor pattern layer OSL2 through a contact-hole 118 passing through the fifth insulation layer 50. A connection electrode TCNE3 disposed on the sixth insulation layer 60 may be connected (e.g., electrically connected) to the connection electrode TCNE2 through a contact-hole 119 passing through the sixth insulation layer 60.

On the seventh insulation layer 70, the light emitting element OLED may be disposed. A first electrode AE of the light emitting element OLED may be disposed on the seventh insulation layer 70. The first electrode AE may be an anode. On the seventh insulation layer 70, a pixel definition film PDL may be disposed. An opening of the pixel definition film PDL may expose at least a portion of the first electrode AE. On the first electrode AE, a hole control layer HCL, a light emitting layer EML, an electron control layer ECL, and a second electrode CE may be disposed. The hole control layer HCL may include a hole transport layer and a hole injection layer. The electron control layer ECL may include an electron transport layer and an electron injection layer. On the second electrode CE, the thin film encapsulation layer TFE may be disposed.

Figure 11:
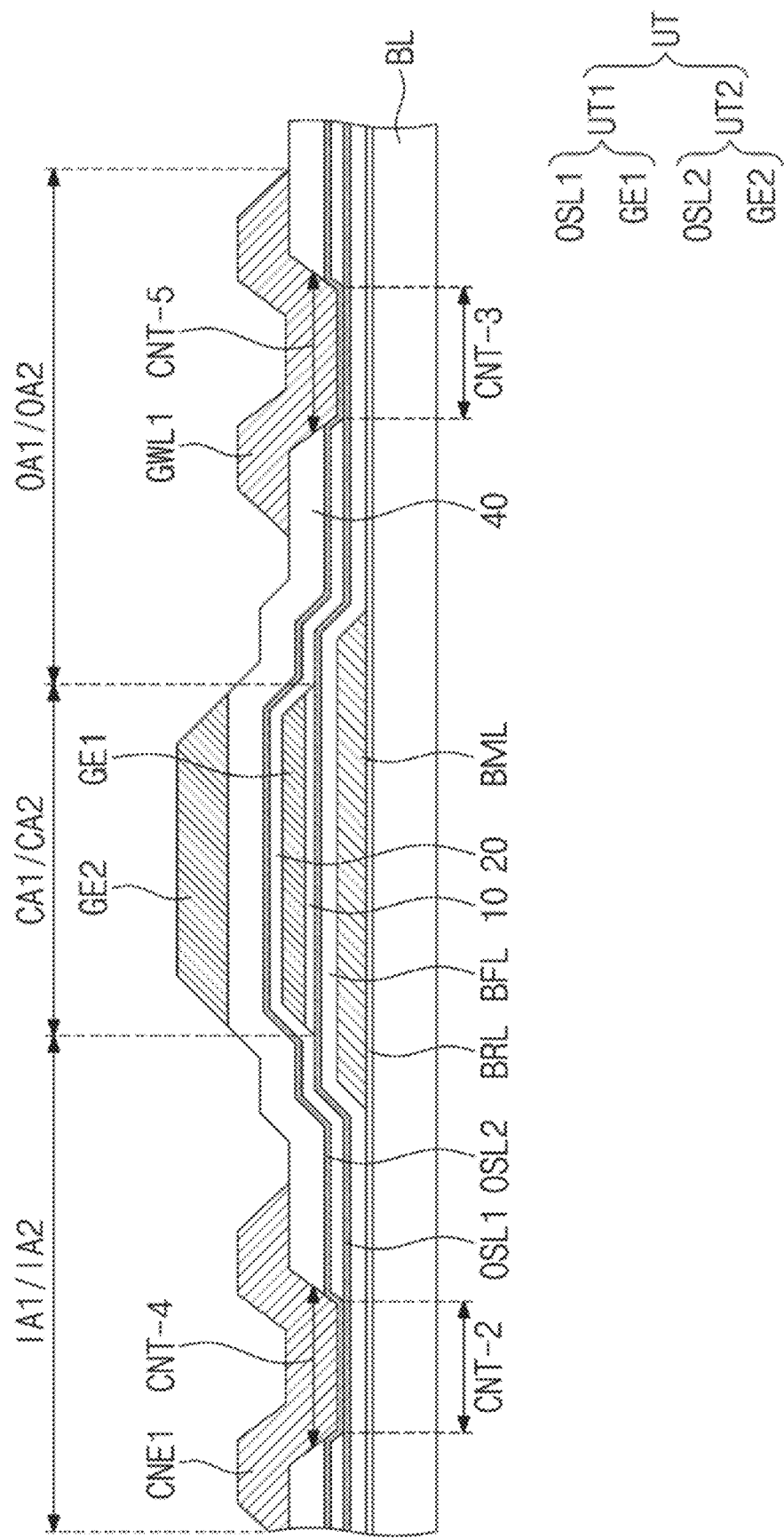
FIG. 11 is a schematic cross-sectional view of a scan driving circuit according to an embodiment.

FIG. 11 is a schematic cross-sectional view of a scan driving circuit according to an embodiment. FIG. 11 illustrates a cross-section corresponding to FIG. 8B. Differences from the scan driving circuit of FIG. 8B will be described.

Referring to FIG. 11, the third insulation layer 30 of FIG. 8B will be omitted. The fourth insulation layer 40 may cover (e.g., directly cover) the second semiconductor pattern layer OSL2. The second gate electrode GE2 may be disposed on the fourth insulation layer 40, and may overlap the first gate electrode GEL. The second gate electrode GE2 may be formed by the same process of the first connection electrode CNE1 and the scan line GWL1, and may include the same material.

The fourth insulation layer 40 may include an inorganic material having relatively a low hydrogen density such that the second semiconductor pattern layer OSL2 may not be reduced during a process of forming the fourth insulation layer 40. After the second gate electrode GE2 is formed, a dopant may be injected into the second semiconductor pattern layer OSL2 through a hydrogen injection process.

According to the above description, a first semiconductor pattern layer, a first gate electrode, a second semiconductor pattern layer, and a second gate electrode, which are disposed to be laminated in a thickness direction, define transistors connected in parallel. The transistors connected in parallel may suppress the delay of a scan signal.

Since the transistors connected in parallel are laminated in the thickness direction, the occupancy area of a transistor may be reduced. As a result, the area of a non-display region may be reduced.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display panel comprising:
a base layer including a display region and a non-display region disposed adjacent to the display region;
a plurality of insulation layers disposed on the non-display region;
a pixel circuit disposed on the display region;
a light emitting element disposed on the display region and electrically connected to the pixel circuit;
a shielding electrode disposed on the non-display region; and
a scan driving circuit disposed on the non-display region, the scan driving circuit including a first transistor configured to output a scan signal of a first logic level during a turn-on period of the first transistor,
wherein the first transistor includes:
a first semiconductor pattern layer including:
a first input region,
a first output region, and
a first channel region disposed between the first input region and the first output region, the first channel region overlapping the shielding electrode;
a first gate electrode disposed on the first semiconductor pattern layer and overlapping each of the first channel region and the shielding electrode;
a second semiconductor pattern layer disposed on the first gate electrode, the second semiconductor pattern layer including:
a second input region electrically connected to the first input region through a first contact hole,
a second output region electrically connected to the first output region through a second contact hole, and
a second channel region disposed between the second input region and the second output region and overlapping the first channel region; and
a second gate electrode disposed on the second semiconductor pattern layer, overlapping the second channel region, and electrically connected to the first gate electrode, and
wherein, in a view perpendicular to an upper surface of the base layer, the shielding electrode is disposed between and spaced apart from each of the first contact hole and the second contact hole.

2. The display panel of claim 1, wherein the shielding electrode is electrically insulated from each of the first semiconductor pattern layer and the second semiconductor pattern layer.

3. A display panel, comprising:
a base layer including a display region and a non-display region adjacent to the display region;
a plurality of insulation layers disposed on the non-display region;
a pixel circuit disposed on the display region;
a light emitting element disposed on the display region and electrically connected to the pixel circuit; and
a scan driving circuit disposed on the non-display region, the scan driving circuit including a first transistor configured to output a scan signal of a first logic level during a turn-on period of the first transistor,
wherein the first transistor includes:
a first semiconductor pattern layer including:
a first input region,
a first output region, and
a first channel region disposed between the first input region and the first output region;
a first gate electrode disposed on the first semiconductor pattern layer and overlapping the first channel region;
a second semiconductor pattern layer disposed on the first gate electrode, the second semiconductor pattern layer including:
a second input region electrically connected to the first input region,
a second output region electrically connected to the first output region, and
a second channel region disposed between the second input region and the second output region, the second channel region overlapping the first channel region; and
a second gate electrode disposed on the second semiconductor pattern layer, overlapping the second channel region, and electrically connected to the first gate electrode,
wherein the pixel circuit comprises:
a first-type transistor including a semiconductor pattern layer disposed on a same layer as a layer on which the first semiconductor pattern layer is disposed and including a same oxide semiconductor as the first semiconductor pattern layer; and
a second-type transistor including a semiconductor pattern layer disposed on a same layer as a layer on which the second semiconductor pattern layer is disposed and including a same oxide semiconductor as the second semiconductor pattern layer, and
wherein at least one of the first-type transistor and the second-type transistor is configured to receive the scan signal.

4. The display panel of claim 3, wherein the plurality of insulation layers comprises:
a first insulation layer disposed between the first channel region and the first gate electrode;
a second insulation layer disposed between the first gate electrode and the second semiconductor pattern layer;
a third insulation layer disposed between the second channel region and the second gate electrode; and
a fourth insulation layer covering the second gate electrode and disposed on the third insulation layer.

5. The display panel of claim 4, wherein
the second input region of the second semiconductor pattern layer is connected to the first input region of the first semiconductor pattern layer through a first contact-hole passing through the second insulation layer; and
the second output region of the second semiconductor pattern layer is connected to the first output region of the first semiconductor pattern layer through a second contact-hole passing through the second insulation layer.

6. The display panel of claim 5, further comprising:
a first conductive pattern layer connected to the second input region of the second semiconductor pattern layer through a third contact-hole passing through the fourth insulation layer, the first conductive pattern layer being configured to provide a clock signal to the first input region of the first semiconductor pattern layer and the second input region of the second semiconductor pattern layer; and
a scan signal line connected to the second output region of the second semiconductor pattern layer through a fourth contact-hole passing through the fourth insulation layer, the scan signal line being configured to receive the scan signal of the first logic level during the turn-on period of the first transistor.

7. The display panel of claim 3, wherein the scan driving circuit further comprises a second transistor configured to output the scan signal of a second logic level during a turn-on period of the second transistor, the second logic level being different from the first logic level.

8. The display panel of claim 7, wherein the second transistor comprises:
   a third semiconductor pattern layer including:
      a third input region,
      a third output region, and
      a third channel region disposed between the third input region and the third output region;
   a third gate electrode disposed on the third semiconductor pattern layer and overlapping the third channel region;
   a fourth semiconductor pattern layer disposed on the third gate electrode, the fourth semiconductor pattern layer including:
      a fourth input region electrically connected to the third input region,
      a fourth output region electrically connected to the third output region, and
      a fourth channel region disposed between the fourth input region and the fourth output region and overlapping the third channel region; and
   a fourth gate electrode disposed on the fourth semiconductor pattern layer, overlapping the fourth channel region, and electrically connected to the third gate electrode.

9. The display panel of claim 8, wherein
   the first semiconductor pattern layer and the third semiconductor pattern layer are disposed on a same layer, and include a same oxide semiconductor; and
   the second semiconductor pattern layer and the fourth semiconductor pattern layer are disposed on a same layer, and include a same oxide semiconductor.

10. The display panel of claim 9, further comprising:
    a second conductive pattern layer connected to the fourth input region of the fourth semiconductor pattern layer to provide a reference voltage corresponding to the scan signal of the second logic level to the fourth input region of the fourth semiconductor pattern layer; and
    a scan signal line connected to the fourth output region of the fourth semiconductor pattern layer to receive the scan signal of the second logic level during the turn-on period of the second transistor.

11. The display panel of claim 3, wherein the plurality of insulation layers comprise:
    a first insulation layer disposed between the first channel region and the first gate electrode;
    a second insulation layer disposed between the first gate electrode and the second semiconductor pattern layer; and
    a third insulation layer disposed between the second semiconductor pattern layer and the second gate electrode.

12. The display panel of claim 11, wherein
    the second input region of the second semiconductor pattern layer is connected to the first input region of the first semiconductor pattern layer through a first contact-hole passing through the second insulation layer; and
    the second output region of the second semiconductor pattern layer is connected to the first output region of the first semiconductor pattern layer through a second contact-hole passing through the second insulation layer.

13. The display panel of claim 12, further comprising:
    a first conductive pattern layer connected to the second input region of the second semiconductor pattern layer through a third contact-hole passing through the third insulation layer, the first conductive pattern being configured to provide a clock signal to the first input region of the first semiconductor pattern layer and the second input region of the second semiconductor pattern layer; and
    a scan signal line connected to the second output region of the second semiconductor pattern layer through a fourth contact-hole passing through the third insulation layer, the scan signal line being configured to receive the scan signal of the first logic level during the turn-on period of the first transistor.

14. The display panel of claim 13, wherein the second gate electrode and the first conductive pattern layer are disposed on a same layer as each other, and include a same material.

15. A display panel comprising:
    a base layer including a display region and a non-display region disposed adjacent to the display region;
    a plurality of insulation layers disposed on the non-display region;
    a pixel circuit disposed on the display region;
    a light emitting element disposed on the display region and electrically connected to the pixel circuit; and
    a scan driving circuit disposed on the non-display region, the scan driving circuit including:
       a first transistor configured to output a scan signal of a first logic level during a turn-on period of the first transistor, and
       a second transistor configured to output the scan signal of a second logic level during a turn-on period of the second transistor, the second logic level being different from the first logic level,
    wherein the first transistor includes:
       a plurality of first semiconductor pattern layers extending in a first direction and arranged in a second direction intersecting the first direction, each of the plurality of first semiconductor pattern layers including:
          a first input region,
          a first output region,
          a first channel region disposed between the first input region and the first output region,
          a 1-1 input region, and
          a 1-1 channel region disposed between the 1-1 input region and the first output region;
       a first gate electrode disposed on the plurality of first semiconductor pattern layers, the first gate electrode including:
          a first portion overlapping the first channel region of each of the plurality of first semiconductor pattern layers, and
          a second portion overlapping the 1-1 channel region of each of the plurality of first semiconductor pattern layers;
       a plurality of second semiconductor pattern layers disposed to correspond to the plurality of first semiconductor pattern layers, each of plurality of second semiconductor pattern layers including:
          a second input region electrically connected to the first input region,
          a second output region electrically connected to the first output region, a second channel region disposed between the second input region and the second output region and overlapping the first channel region,
a 2-1 input region electrically connected to the 1-1 input region, and
a 2-1 channel region disposed between the 2-1 input region and the second output region and overlapping the 1-1 channel region; and
a second gate electrode disposed on the plurality of second semiconductor pattern layers, the second gate electrode including:
a third portion overlapping the second channel region of each of the plurality of second semiconductor pattern layers, and
a fourth portion overlapping the 2-1 channel region of each of the plurality of second semiconductor pattern layers.

16. The display panel of claim 15, wherein the plurality of insulation layers comprise:
a first insulation layer disposed between the first channel region of each of the plurality of first semiconductor pattern layers and the first portion and between the 1-1 channel region and the second portion;
a second insulation layer disposed between the first gate electrode and the plurality of second semiconductor pattern layers;
a third insulation layer disposed between the second channel region of each of the plurality of second semiconductor pattern layers and the third portion and between the 2-1 channel region and the fourth portion; and
a fourth insulation layer covering the second gate electrode and disposed on the third insulation layer.

17. The display panel of claim 16, wherein
the second input region of each of the plurality of second semiconductor pattern layers is connected to the first input region of a corresponding first semiconductor pattern layer among the plurality of first semiconductor pattern layers through a first contact-hole passing through the second insulation layer;
the second output region of each of the plurality of second semiconductor pattern layers is connected to the first output region of the corresponding first semiconductor pattern layer through a second contact-hole passing through the second insulation layer; and
the 2-1 input region of each of the plurality of second semiconductor pattern layers is connected to the 1-1 input region of the corresponding first semiconductor pattern layer through a 1-1 contact-hole passing through the second insulation layer.

18. The display panel of claim 17, further comprising:
a first conductive pattern layer including:
a first conductive pattern portion connected to the second input region of a corresponding second semiconductor pattern layer among the plurality of second semiconductor pattern layers through a third contact-hole passing through the fourth insulation layer, the first conductive pattern portion being configured to provide a clock signal to the second input region, and
a second conductive pattern portion connected to the 2-1 input region of a corresponding second semiconductor pattern layer among the plurality of second semiconductor pattern layers through a 3-1 contact-hole passing through the fourth insulation layer, the second conductive pattern portion being configured to provide the clock signal to the 2-1 input region; and
a scan signal line connected to the second output region of a corresponding second semiconductor pattern layer among the plurality of second semiconductor pattern layers through a fourth contact-hole passing through the fourth insulating layer, the scan signal line being configured to receive the scan signal of the first logic level during the turn-on period of the first transistor.

19. The display panel of claim 18, wherein the scan signal line is disposed between the first conductive pattern portion and the second conductive pattern portion in the first direction.

20. The display panel of claim 18, wherein a length of the first conductive pattern portion is less than a length of the second conductive pattern portion in the second direction.

21. The display panel of claim 18, wherein the second transistor comprises:
a plurality of third semiconductor pattern layers, each of the plurality of third semiconductor pattern layers including:
a third input region,
a third output region, and
a third channel region disposed between the third input region and the third output region;
a third gate electrode disposed on the plurality of third semiconductor pattern layers and overlapping the third channel region of each of the plurality of third semiconductor pattern layers;
a fourth semiconductor pattern layer on the third gate electrode, the fourth semiconductor pattern layer including:
a fourth input region electrically connected to the third input region,
a fourth output region electrically connected to the third output region, and
a fourth channel region disposed between the fourth input region and the fourth output region and overlapping the third channel region; and
a fourth gate electrode disposed on the fourth semiconductor pattern layer, overlapping the fourth channel region of the fourth semiconductor pattern layer, and electrically connected to the third gate electrode.

22. The display panel of claim 21, wherein
the plurality of first semiconductor pattern layers and the plurality of third semiconductor pattern layers are disposed on a same layer, and include a same oxide semiconductor; and
the plurality of second semiconductor pattern layers and the fourth semiconductor pattern layer are disposed on a same layer, and include a same oxide semiconductor.

23. The display panel of claim 21, further comprising:
a second conductive pattern layer connected to the fourth input region, the second conductive pattern layer being configured to provide a reference voltage corresponding to the scan signal of the second logic level to the fourth input region.

24. The display panel of claim 23, wherein the scan signal line is connected to the fourth output region and is configured to receive the scan signal of the second logic level during the turn-on period of the second transistor.

25. The display panel of claim 23, wherein
the second portion of the first gate electrode, the fourth portion of the second gate electrode, and the second conductive pattern portion of the first conductive pattern layer are extended along the scan signal line;

each of the plurality of third semiconductor pattern layers further comprises:
- a 1-1 input region, and
- a 1-1 channel region disposed between the 1-1 input region and the third output region;

the fourth semiconductor pattern layer further comprises:
- a 2-1 input region, and
- a 2-1 channel region disposed between the 2-1 input region and the fourth output region;

the second portion of the first gate electrode overlaps the 1-1 channel region of each of the plurality of third semiconductor pattern layers;

the fourth portion of the second gate electrode overlaps the 2-1 channel region of the fourth semiconductor pattern layer; and the second conductive pattern portion of the first conductive pattern layer is electrically connected to the 2-1 input region of the fourth semiconductor.

* * * * *